United States Patent
Chang et al.

(10) Patent No.: US 11,276,698 B2
(45) Date of Patent: Mar. 15, 2022

(54) FLASH MEMORY DEVICE AND MANUFACTURE THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Rongyao Chang, Shanghai (CN); Zhuofan Chen, Shanghai (CN); Haiyang Zhang, Shanghai (CN)

(73) Assignees: Semiconductor Manufacturing International (Beijing) Corporation; Semiconductor Manufacturing International (Shanghai) Corporation

( * ) Notice: Subject to any disclaimer, the term of this patent is extended or adjusted under 35 U.S.C. 154(b) by 0 days.

(21) Appl. No.: 16/535,649

(22) Filed: Aug. 8, 2019

(65) Prior Publication Data
US 2019/0363097 A1    Nov. 28, 2019

Related U.S. Application Data

(62) Division of application No. 15/786,316, filed on Oct. 17, 2017, now abandoned.

(30) Foreign Application Priority Data

Oct. 17, 2016  (CN) .......................... 201610900637.5

(51) Int. Cl.
*H01L 29/788*    (2006.01)
*H01L 29/792*    (2006.01)
(Continued)

(52) U.S. Cl.
CPC .... *H01L 27/11526* (2013.01); *H01L 27/1052* (2013.01); *H01L 27/11521* (2013.01);
(Continued)

(58) Field of Classification Search
CPC .......................... H01L 27/11551–11556; H01L 27/11578–11582; H01L 21/7682
See application file for complete search history.

(56) References Cited

U.S. PATENT DOCUMENTS 9,646,989 B1 *   5/2017   Yoshimizu ........ H01L 27/11578
9,754,963 B1 *   9/2017   Kawamura ....... H01L 27/11582
(Continued)

FOREIGN PATENT DOCUMENTS

| CN | 104520992 A | 4/2015 |
|----|-------------|--------|
| CN | 105261617 A | 1/2016 |
| WO | 2014/028140 A1 | 2/2014 |

OTHER PUBLICATIONS

Jaehoon Jang, et al., "Vertical cell array using TCAT (Terabit Cell Array Transistor) Technology for Ultra High Density NAND Flash Memory," 2009 Symposium on VLSI Technology Digest of Technical Papers, 2 pages.
(Continued)

*Primary Examiner* — Eric A. Ward
(74) *Attorney, Agent, or Firm* — Innovation Counsel LLP

(57) ABSTRACT

A flash memory device and its manufacturing method, which is related to semiconductor techniques. The flash memory device comprises: a substrate; and a memory unit on the substrate, comprising: a channel structure on the substrate, wherein the channel structure comprise, in an order from inner to outer of the channel structure, a channel layer, an insulation layer wrapped around the channel layer, and a charge capture layer wrapped around the insulation layer; a plurality of gate structures wrapped around the
(Continued)

channel structure and arranged along a symmetry axis of the channel structure, wherein there exist cavities between neighboring gate structures; a support structure supporting the gate structures; and a plurality of gate contact components each contacting a gate structure. The cavities between neighboring gate structures lower the parasitic capacitance, reduce inter-gate interference, and suppress the influence from writing or erasing operations of nearby memory units.

12 Claims, 17 Drawing Sheets

(51) Int. Cl.
  H01L 27/11526 (2017.01)
  H01L 27/11582 (2017.01)
  H01L 27/11556 (2017.01)
  H01L 27/105 (2006.01)
  H01L 27/11521 (2017.01)
  H01L 27/11546 (2017.01)
  H01L 27/11551 (2017.01)
(52) U.S. Cl.
  CPC .. *H01L 27/11546* (2013.01); *H01L 27/11551* (2013.01); *H01L 27/11556* (2013.01); *H01L 27/11582* (2013.01); *H01L 29/7889* (2013.01); *H01L 29/7923* (2013.01); *H01L 29/7926* (2013.01)

(56) References Cited

U.S. PATENT DOCUMENTS

| | | |
|---|---|---|
| 2010/0320526 A1 | 12/2010 | Kidoh et al. |
| 2012/0052674 A1* | 3/2012 | Lee ................... H01L 29/7926 438/591 |
| 2014/0264547 A1 | 9/2014 | Kawai et al. |
| 2015/0294980 A1 | 10/2015 | Lee et al. |
| 2016/0049423 A1* | 2/2016 | Yoo ................... H01L 27/11582 257/324 |
| 2016/0079069 A1 | 3/2016 | Uenaka et al. |
| 2016/0126248 A1 | 5/2016 | Rabkin |
| 2016/0148835 A1 | 5/2016 | Shimabukuro et al. |
| 2016/0260733 A1* | 9/2016 | Lue ................... H01L 27/11582 |
| 2016/0268209 A1 | 9/2016 | Pachamuthu et al. |
| 2016/0365351 A1 | 12/2016 | Nishikawa et al. |
| 2017/0207232 A1 | 7/2017 | You et al. |
| 2017/0213845 A1 | 7/2017 | Baba |
| 2017/0229474 A1* | 8/2017 | Shimizu ............ H01L 27/11582 |
| 2017/0263558 A1 | 9/2017 | Shingu et al. |

OTHER PUBLICATIONS

European Search Report, EP17196553, dated Mar. 23, 2018, 1 page.

* cited by examiner

FLASH MEMORY DEVICE AND MANUFACTURE THEREOF

CROSS-REFERENCE TO RELATED APPLICATIONS

This application is a divisional application of U.S. patent application Ser. No. 15/786,316 filed on Oct. 17, 2017, which claims priority to Chinese Patent Application No. 201610900637.5 filed on Oct. 17, 2016, which is incorporated herein by reference in its entirety.

BACKGROUND

(a) Field of the Invention

This inventive concept is related generally to a semiconductor technology, and more specifically to a flash memory device and its manufacturing method.

(b) Description of the Related Art

3D NAND flash memory techniques are progressing rapidly in recent years and 3D NAND flash memory based on Terabit Cell Array Transistor (TCAT) is the latest development in this area.

Advancements in manufacturing techniques boost the total number and, accordingly, the total thickness of Oxide-Nitride pairs (O—N pairs) in a 3D NAND flash memory. The total thickness of the O—N pairs, however, is capped by physical limitations of the device, such as maximum allowable heat generated in a working condition. Therefore, to fit in more O—N pairs, the thickness of each individual pair need to be reduced.

In manufacturing a 3D NAND flash memory, the nitride in each O—N pair will eventually be removed and replaced with metal gate. The remaining oxide in the O—N pair and two neighboring gate structures sandwiching the oxide form a parasitic capacitance. Reduction in the thickness of each individual O—N pair (and hence the thickness of oxide in the O—N pair) results in an increased parasitic capacitance that would have a more prominent adversary effect on the overall performance of the device. Hence, a flash memory device with small parasitic capacitance and inter-gate interference is desirable.

SUMMARY

This inventive concept presents a flash memory device with smaller parasitic capacitance and less inter-gate interference than its conventional counterparts.

This flash memory device comprises:
a substrate; and
a memory unit on the substrate, comprising:
a channel structure on the substrate, wherein the channel structure comprises, in an order from inner to outer of the channel structure, a channel layer, an insulation layer wrapped around the channel layer, and a charge capture layer wrapped around the insulation layer;
a plurality of gate structures wrapped around the channel structure and arranged along an axis of symmetry of the channel structure, with cavities between neighboring gate structures;
a support structure supporting the gate structures; and
a plurality of gate contact components each contacting a gate structure.

Additionally, in the aforementioned device, the support structure may comprise at least one pillar support component comprising a pillar kernel and a cover layer around the pillar kernel.

Additionally, in the aforementioned device, the pillar kernel may be made of silicon dioxide and the cover layer may be made of undoped polycrystalline silicon.

Additionally, in the aforementioned device, the channel structure may further comprise an anti-etching layer wrapped around the side surfaces of the charge capture layer.

Additionally, in the aforementioned device, the anti-etching layer may be made of a High Temperature Oxide (HTO), wherein the HTO is a silicon oxide formed in a temperature range from 300 to 500 Celsius degree.

Additionally, in the aforementioned device, the channel structure may further comprise a channel kernel surrounded by the channel layer.

Additionally, in the aforementioned device, the memory unit may comprise a plurality of channel structures arranged in the gate structures.

Additionally, in the aforementioned device, each of the gate structures may comprise a gate, a work function regulation layer on the surface of the gate, and a high-K dielectric layer on the surface of the work function regulation layer, wherein a first portion of the high-K dielectric layer is located between the gate and the channel structure and a second portion of the high-K dielectric layer is located between the gate and the pillar support component.

Additionally, in the aforementioned device, the gate structures may form a staircase pattern, and each of the gate contact components contacts the gate of a corresponding gate structure at a step of the staircase pattern, and each of the pillar support components is also located on a step of the staircase pattern and separating from the gate contact components.

Additionally, the aforementioned device may further comprising:
a plurality of the memory units separated from each other;
a groove metal filling layer; and
an interval layer, wherein both the groove metal filling layer and the interval layer are located on the substrate between the neighboring memory units, and the interval layer separates the groove metal filling layer from the gate structures.

Additionally, in the aforementioned device, the substrate further may comprise a doped region in the substrate contacting the groove metal filling layer.

Additionally, the aforementioned device may further comprise an inter-layer dielectric layer on the gate structures wrapped around the support structure and the gate contact components.

This inventive concept further presents a method for manufacturing a flash memory device, comprising:
providing a substrate;
forming a plurality of first sacrificial layers and a plurality of second sacrificial layers stacked in an alternating manner, wherein the first sacrificial layers contain material that is different from the second sacrificial layers;
forming a support structure in the first sacrificial layers and the second sacrificial layers;
forming a first through-hole exposing an upper surface of the substrate by etching the first sacrificial layers and the second sacrificial layers;
forming a channel structure in the first through-hole, wherein the channel structure comprises, in an order from inner to outer of the channel structure, a channel layer, an insulation layer wrapped around the channel layer, and a charge capture layer wrapped around the insulation layer;

forming a plurality of first cavities by removing the first sacrificial layers;

forming a plurality of gate structures in the first cavities;

forming a plurality of second cavities between neighboring gate structures by removing the second sacrificial layers; and forming a plurality of gate contact components each connecting to a gate structure.

Additionally, in the aforementioned method, the support structure may comprise at least one pillar support component, and the pillar support component comprises a pillar kernel and a common cover layer wrapped around the pillar kernel.

Additionally, in the aforementioned method, the first sacrificial layers and the second sacrificial layers may form a staircase pattern, and forming a support structure in the first sacrificial layers and the second sacrificial layers comprises:

forming a first dielectric layer on the staircase pattern comprising the first sacrificial layers and the second sacrificial layers;

forming an opening exposing the upper surface of the substrate by etching the first dielectric layer, the first sacrificial layers and the second sacrificial layers;

forming the pillar support component in the opening; and forming a second dielectric layer covering the pillar support component on the first dielectric layer.

Additionally, in the aforementioned method, forming the pillar support component in the opening may comprise:

forming a first cover layer on a side surface and the bottom of the opening;

forming the pillar kernel filling the opening on the first cover layer;

forming a pillar cavity by etching back a portion of the pillar kernel; and forming a second cover layer filling the pillar cavity, wherein the first cover layer and the second cover layer form the common cover layer wrapped around the pillar kernel.

Additionally, in the aforementioned method, the pillar kernel may be made of silicon dioxide and the common cover layer may be made of undoped polycrystalline silicon.

Additionally, in the aforementioned method, the first sacrificial layers may be made of silicon nitride and the second sacrificial layers may be made of silicon dioxide.

Additionally, in the aforementioned method, the channel structure further may comprise an anti-etching layer wrapped around the charge capture layer.

Additionally, in the aforementioned method, the anti-etching layer may be made of a High Temperature Oxide (HTO), wherein the HTO is a silicon oxide formed in a temperature range from 300 to 500 Celsius degree.

BRIEF DESCRIPTION OF THE DRAWINGS

The drawings describe some embodiments of this inventive concept and will be used to describe this inventive concept together with the specification.

DETAILED DESCRIPTION OF THE EMBODIMENTS

Figure 1:
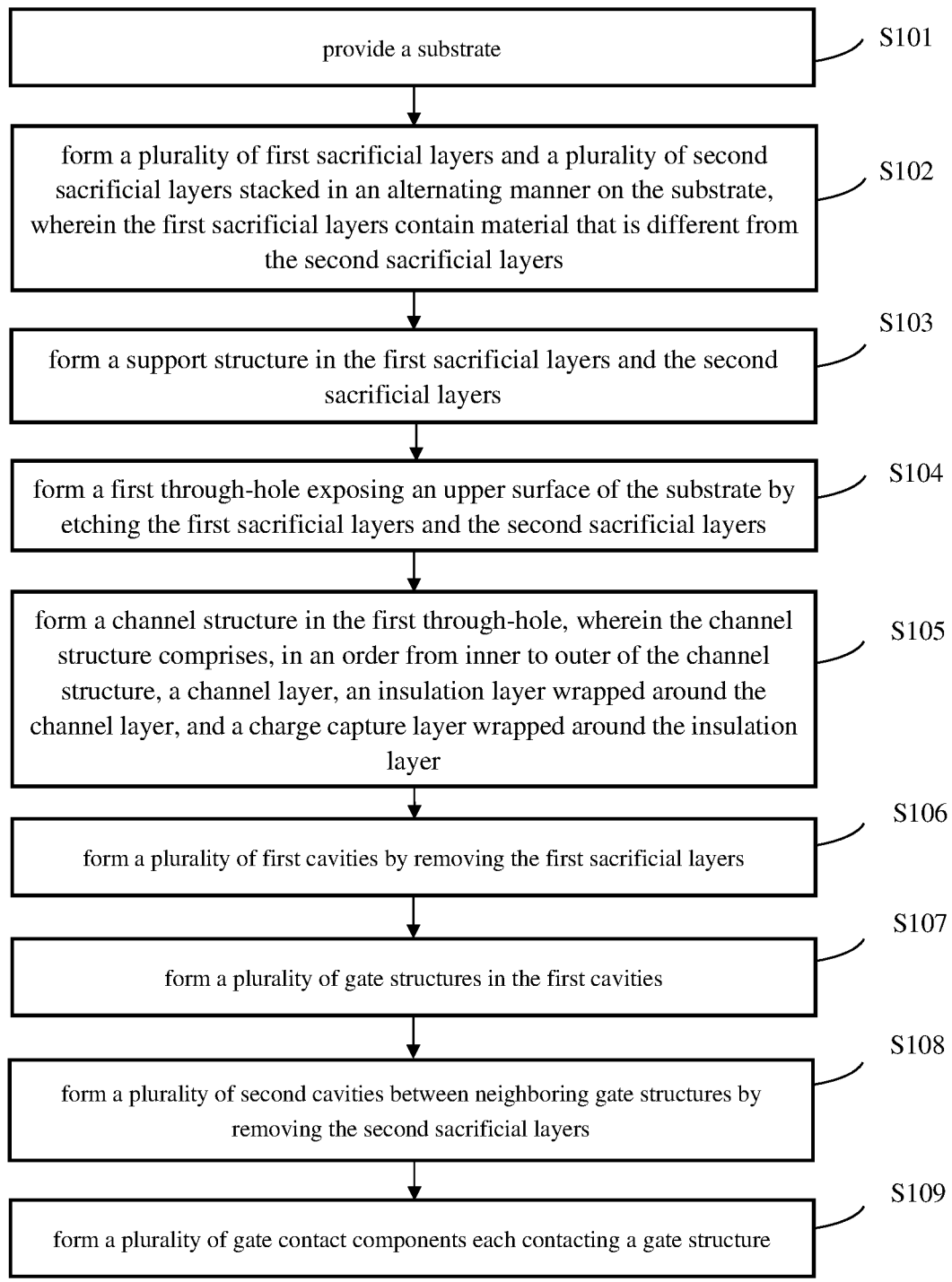
FIG. 1 shows a flowchart illustrating a flash memory manufacturing method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a flash memory manufacturing method in accordance with one or more embodiments of this inventive concept.

In step S101, provide a substrate.

In step S102, form a plurality of first sacrificial layers and a plurality of second sacrificial layers stacking over each other alternately on the substrate, wherein the first sacrificial layers are different from the second sacrificial layers. For example, the first sacrificial layers may be made of silicon nitride and the second sacrificial layers may be made of silicon dioxide.

In step S103, form a support structure in the first sacrificial layers and the second sacrificial layers. In one embodiment, the support structure may comprise at least one pillar support component comprising a pillar kernel and a cover layer wrapped around the pillar kernel. The pillar kernel may be made of silicon dioxide and the cover layer may be made of polycrystalline silicon, such as undoped polycrystalline silicon. The cover layer protects the pillar kernel from being damaged during the succeeding etching process to remove the second sacrificial layers.

In step S104, form a first through-hole exposing an upper surface of the substrate by etching the first sacrificial layers and the second sacrificial layers.

In step S105, form a channel structure in the first through-hole, wherein the channel structure comprises, in an order from inner to outer of the channel structure, a channel layer, an insulation layer (working as a tunnel insulation layer) wrapped around the channel layer, and a charge capture layer wrapped around the insulation layer.

As an example, the channel layer may be made of polycrystalline silicon, the insulation layer may be made of a silicon oxide, and the charge capture layer may be made of silicon nitride. Optionally, the channel structure may further comprise a channel kernel being wrapped around by the channel layer. The channel kernel may be made of silicon dioxide. The composition materials for various layers of the channel structure are demonstrative and are not intended to limit the scope of this inventive concept.

In step S106, form a plurality of first cavities by removing the first sacrificial layers.

In step S107, form a plurality of gate structures in the first cavities. Each of the gate structures may comprise a gate, a work function regulation layer on the surface of the gate, and a high-K dielectric layer on the surface of the work function regulation layer. A first portion of the high-K dielectric layer is located between the gate and the channel structure, and a second portion of the high-K dielectric layer is located between the gate and the pillar support component.

In step S108, form a plurality of second cavities between neighboring gate structures by removing the second sacrificial layers. The second sacrificial layers may be removed by an etching process.

In step S109, form a plurality of gate contact components each contacting a gate structure.

In this manufacturing method, the second cavities are formed between neighboring gate structures by removing the second sacrificial layers, these cavities lower the parasitic capacitance, reduce inter-gate interference, and reduce any unintended effect from writing or erasing operations of nearby memory units.

As an example, due to a smaller dielectric constant of air than silicon dioxide, a 3D NAND flash memory device with the second cavities filled with air has a smaller parasitic capacitance than those of its conventional counterparts.

Additionally, the support structure formed in this manufacturing method provides structural reinforcement to the gate structures, which may be weakened by the second cavities, and prevents them from collapsing.

In one embodiment, the channel structure may further comprise an anti-etching layer wrapped around the charge capture layer. Optimally, the anti-etching layer may be made of a High Temperature Oxide (HTO). As an example, the HTO may be a silicon oxide formed in a temperature range from 300 to 500 Celsius degree (e.g. 400 Celsius degree). Compared to Tetraethyl Orthosilicate (TEOS), HTO has higher compactness and can better resist the etching processes, such as a dry etching like plasma etching or a wet etching process, that will be conducted to remove the second sacrificial layers. Therefore, HTO provides a better protection to the charge capture layer than TEOS.

FIGS. 2, 3, 4, 5, 6, 7, 8, 9, 10, 11A, 11B, 12A, 12B, 13A, 13B, 14, 15, 16, 17, 18A, 18B, 19, 20, 21, 22, 23A, 23B, 24A, 24B, 25A, 25B, 26A, and 26B show schematic cross-sectional views illustrating different stages of a flash memory manufacturing method in accordance with one or more embodiments of this inventive concept. Referring to these drawings, this flash memory manufacturing method will be described in details below.

Figure 2:
FIGS. 2, 3, 4, 5, 6, 7, 8, 9, 10, 11A, 11B, 12A, 12B, 13A, 13B, 14, 15, 16, 17, 18A, 18B, 19, 20, 21, 22, 23A, 23B, 24A, 24B, 25A, 25B, 26A, and 26B show schematic cross-sectional views illustrating different stages of a flash memory manufacturing method in accordance with one or more embodiments of this inventive concept.

First, referring to FIG. 2, a substrate 200, which may be a silicon substrate, is provided.

Then, a plurality of first sacrificial layers 201 and a plurality of second sacrificial layers 202 are formed on the substrate 200, with the first sacrificial layers 201 and the second sacrificial layers 202 stacked in alternating layers. Referring to FIG. 2, a first sacrificial layer 201 may first be deposited on the substrate 200, followed by a second sacrificial layer 202, and followed by another first sacrificial layer 201, and so on. The first sacrificial layers 201 and the second sacrificial layers 202 may be made of different materials. For example, the first sacrificial layer 201 may be made of silicon nitride and the second sacrificial layers 202 may be made of silicon dioxide.

Figure 3:
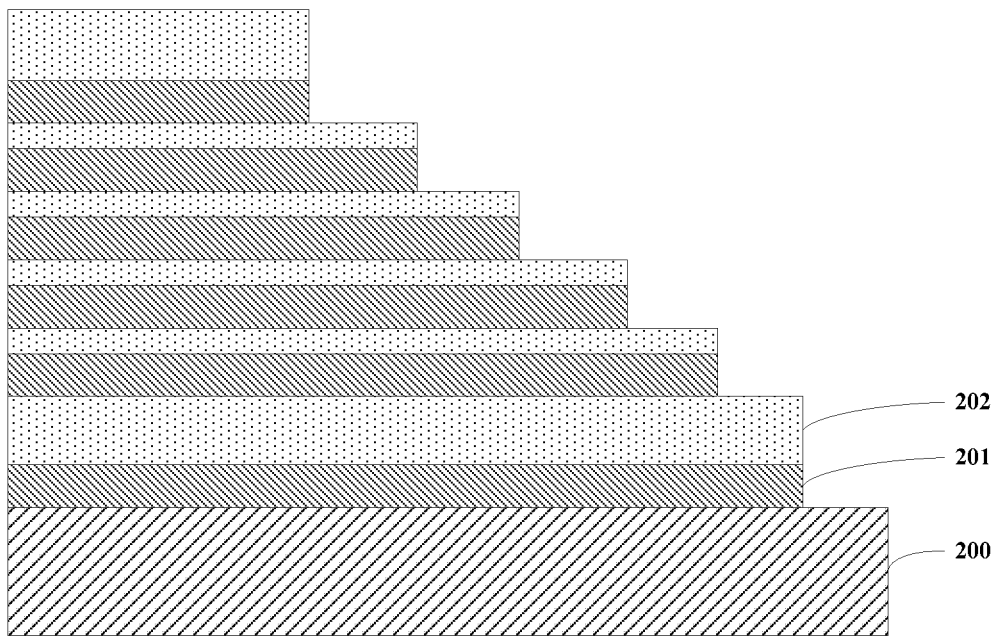

Referring to FIG. 3, a staircase pattern is formed by etching the first sacrificial layers 201 and the second sacrificial layers 202.

It is understood that, for conciseness, FIG. 3 and other drawings may only show a portion of the entire cross-sectional view of the device in this inventive concept. For example, FIG. 3 may only show a portion of the staircase pattern that includes the first sacrificial layers 201 and the second sacrificial layers 202. The views of these drawings are not intended to limit the scope of this inventive concept.

Then, a support structure is formed in the first sacrificial layers 201 and the second sacrificial layers 202, a process to form the support structure will be described below in reference to FIGS. 4, 5, 6, 7, 8, 9, 10, 11A, and 11B.

Figure 4:
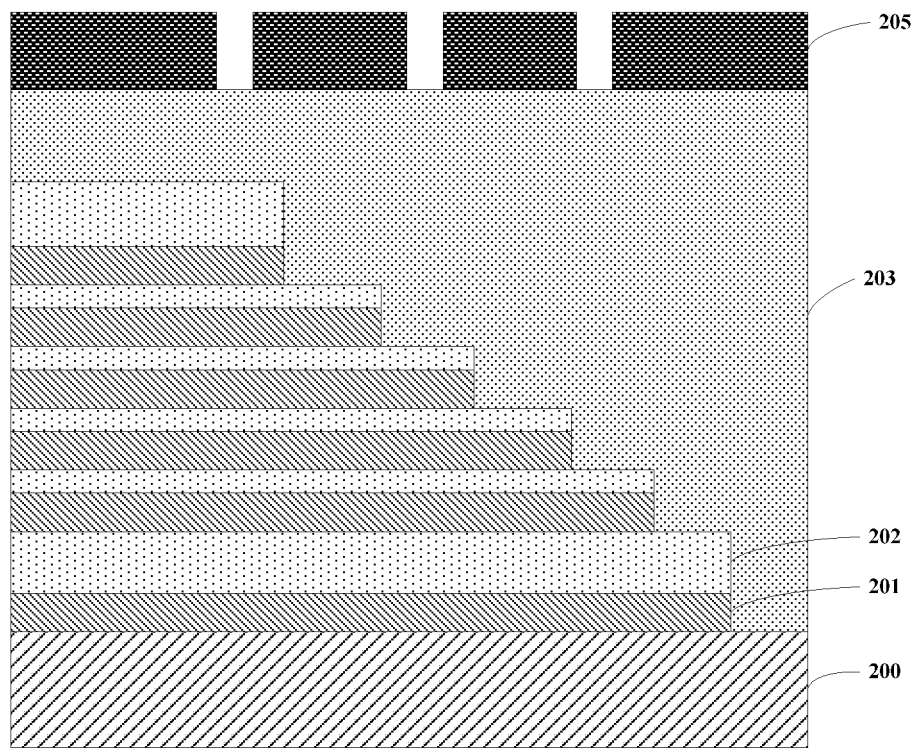

Referring to FIG. 4, a first dielectric layer 203 is formed on the staircase pattern comprising the first sacrificial layers 201 and the second sacrificial layers 202. The first dielectric layer 203 may be made of silicon dioxide.

Figure 5:
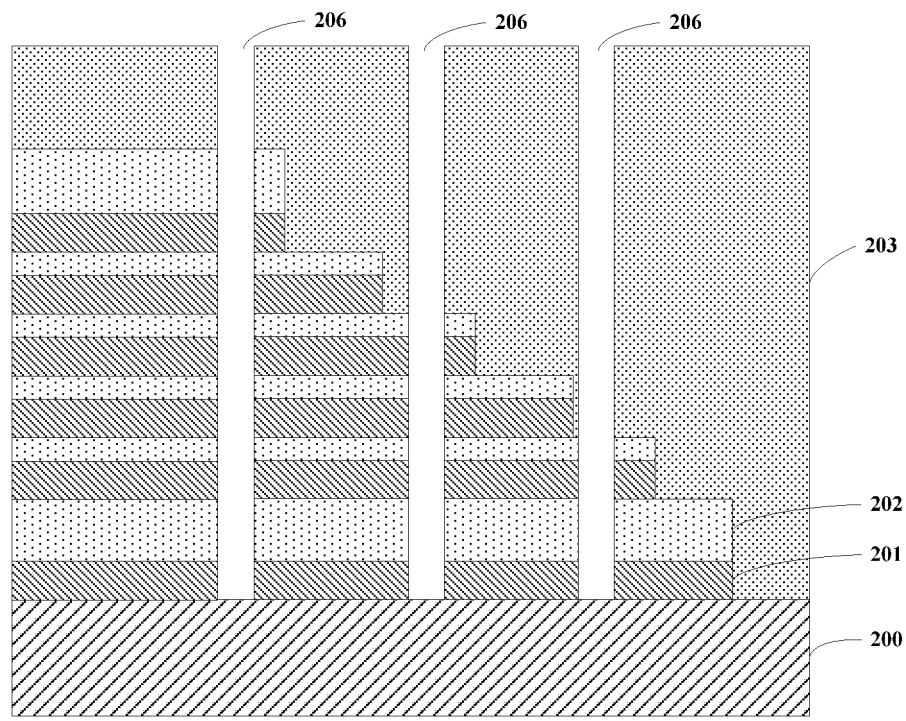

Then, an opening 206 exposing a portion of the upper surface of the substrate 200 is formed by etching the first dielectric layer 203, the first sacrificial layers 201 and the second sacrificial layers 202. Referring to FIG. 4, a patterned hard mask layer 205, which may be a photoresist layer, may first be formed on the first dielectric layer 203, then the opening 206 exposing a portion of the upper surface of the substrate 200 may be formed by etching the first dielectric layer 203, the first sacrificial layers 201 and the second sacrificial layers 202 using the hard mask layer 205 as a mask. After that, the hard mask layer 205 may be removed and a structure as shown in FIG. 5 results.

Then, a pillar support component is formed in the opening 206.

Figure 6:
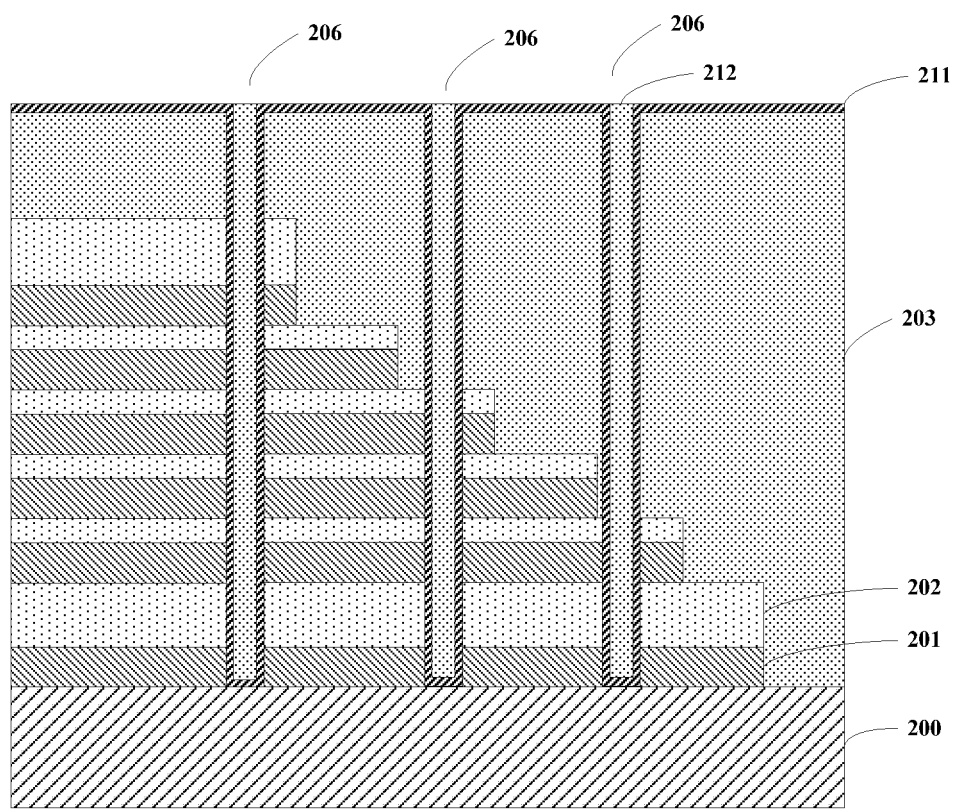

Referring to FIG. 6, a process to form a pillar support component in the opening 206 may comprise: depositing a first cover layer 211 on a side surface and the bottom of the opening 206, wherein the first cover layer 211 may be made of polycrystalline silicon such as undoped nanopolycrystalline silicon; and forming a pillar kernel 212 filling the opening 206 on the first cover layer 211, wherein the pillar kernel 212 may be made of silicon dioxide.

Figure 7:
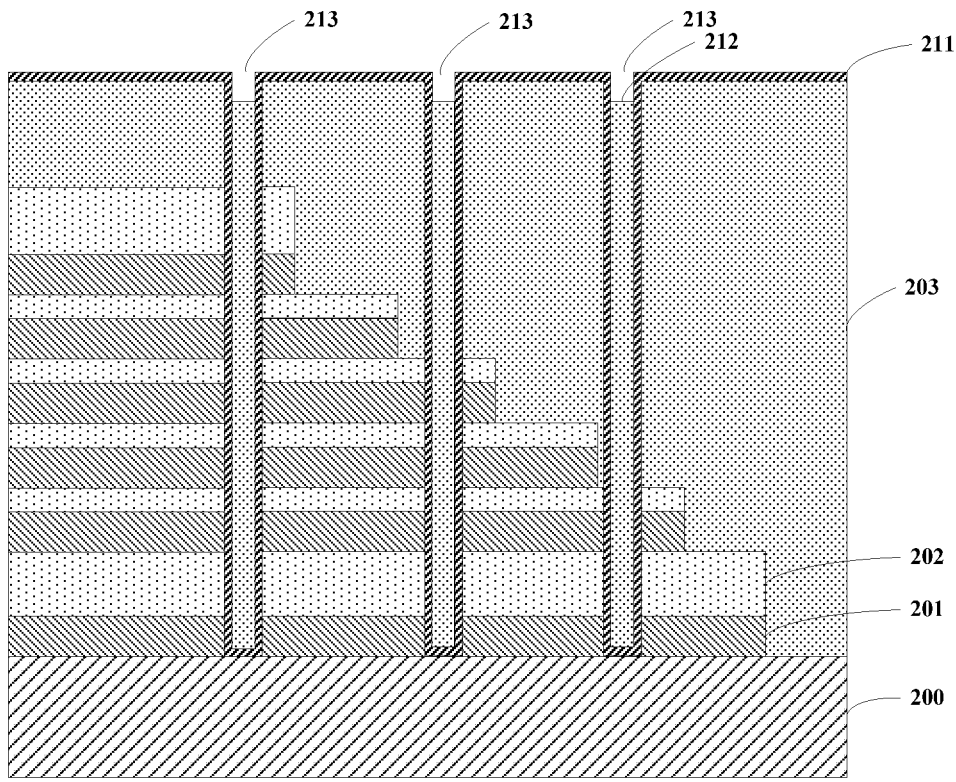

Referring to FIG. 7, optionally, the process to form a pillar support component in the opening 206 may further comprise: forming a pillar cavity 213 by etching back a portion of the pillar kernel 212.

Figure 8:
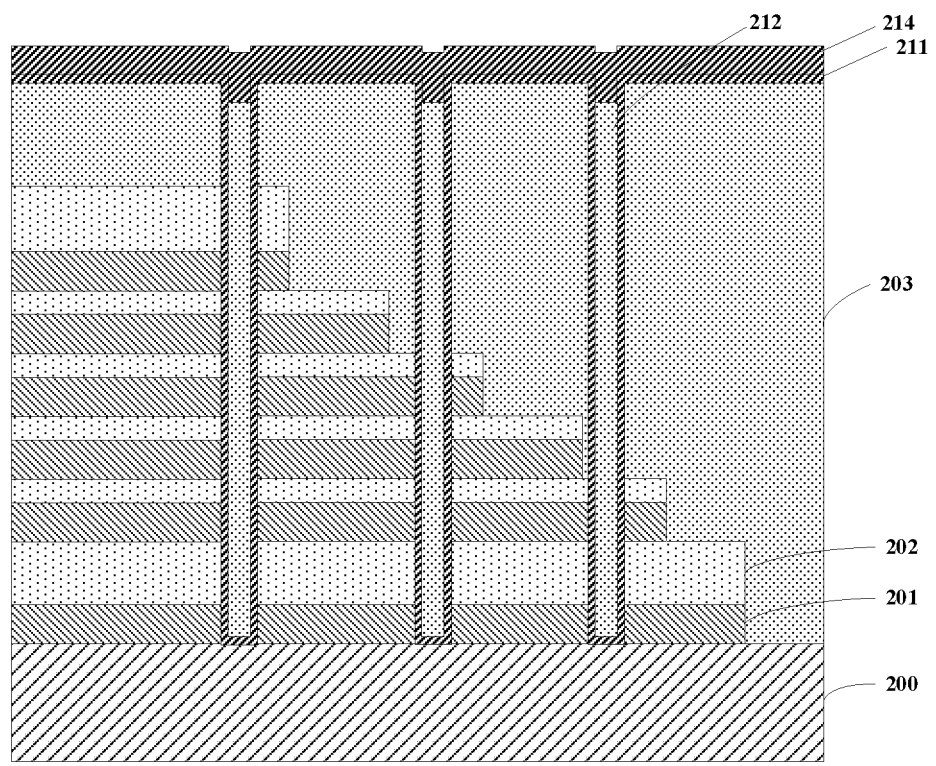
Figure 9:
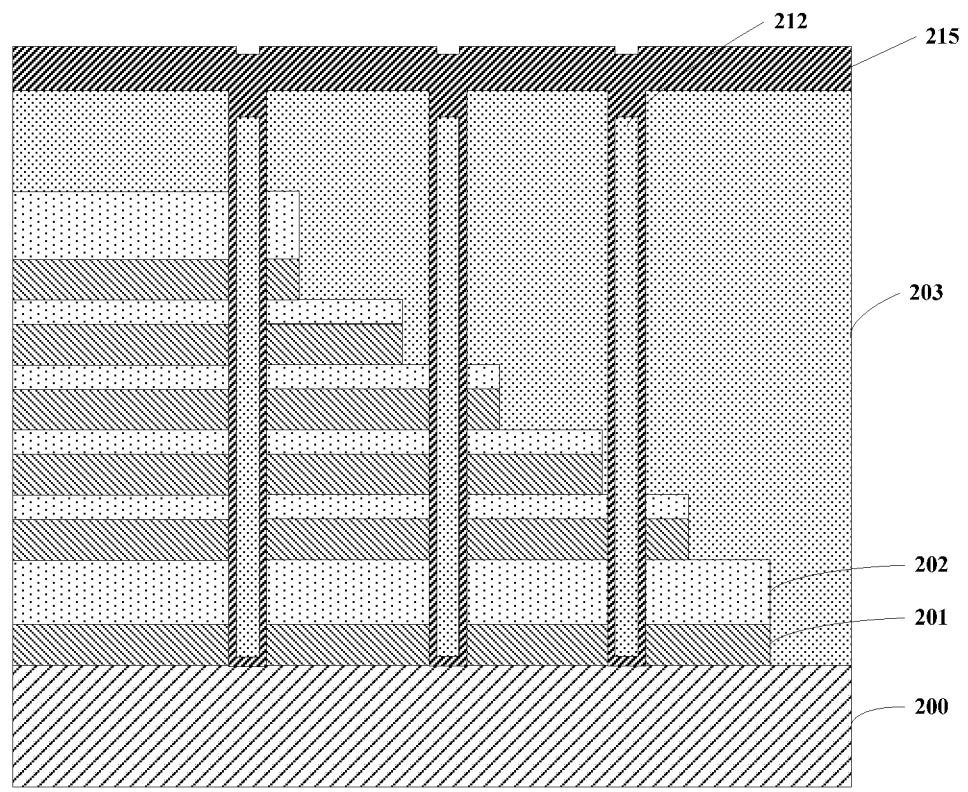

Referring to FIG. 8, optionally, the process to form a pillar support component in the opening 206 may further comprise: depositing a second cover layer 214 filling the pillar cavity 213. The second cover layer 214 may be made of the same material as the first cover layer 211. The first cover layer 211 and the second cover layer 214 wrap the pillar kernel 212. For convenience of this description, the first cover layer 211 and the second cover layer 214 together will be marked as a common cover layer 215 starting from FIG. 9.

Figure 10:
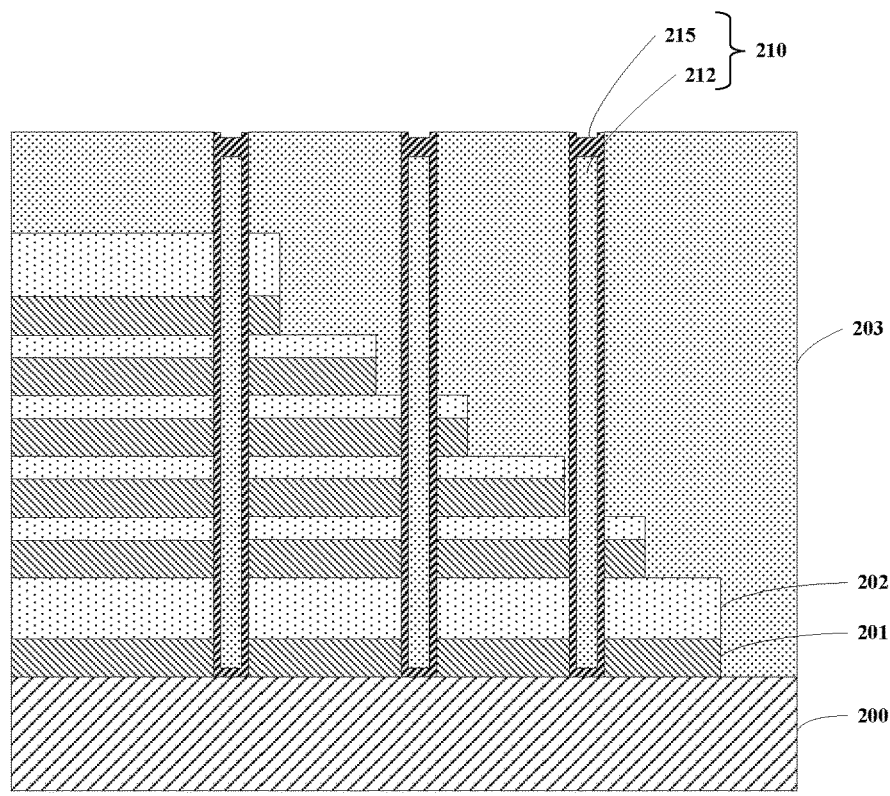

Referring to FIG. 10, optionally, the process to form a pillar support component in the opening 206 may further comprise: forming the pillar support component 210 by removing a portion of the common cover layer 215 on the first dielectric layer 203.

Figure 11A:
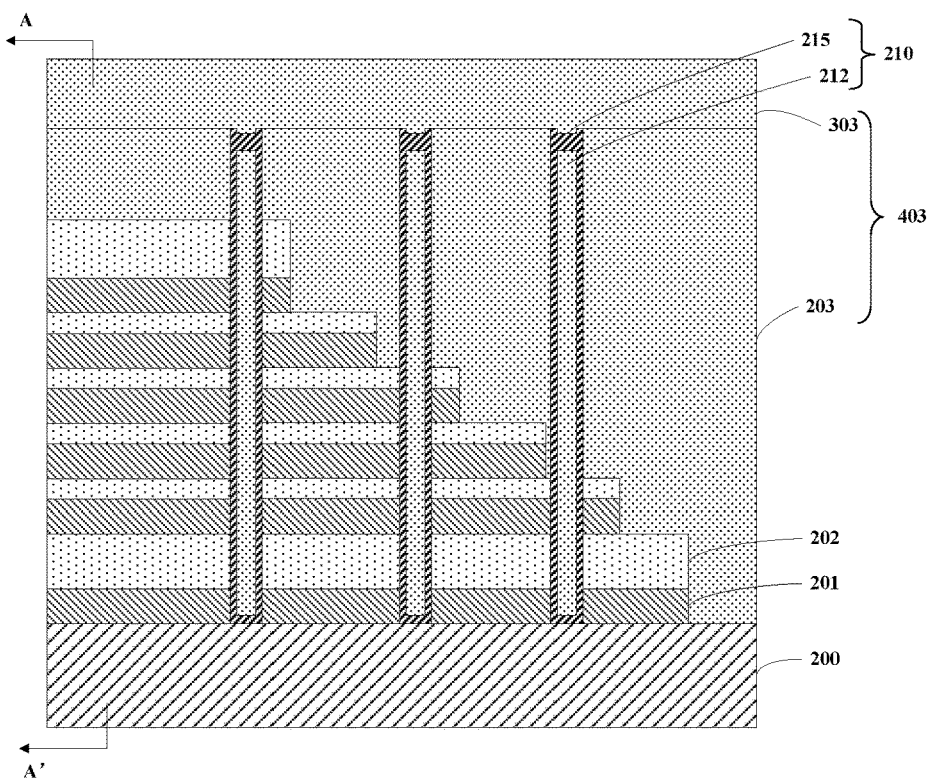
Figure 11B:
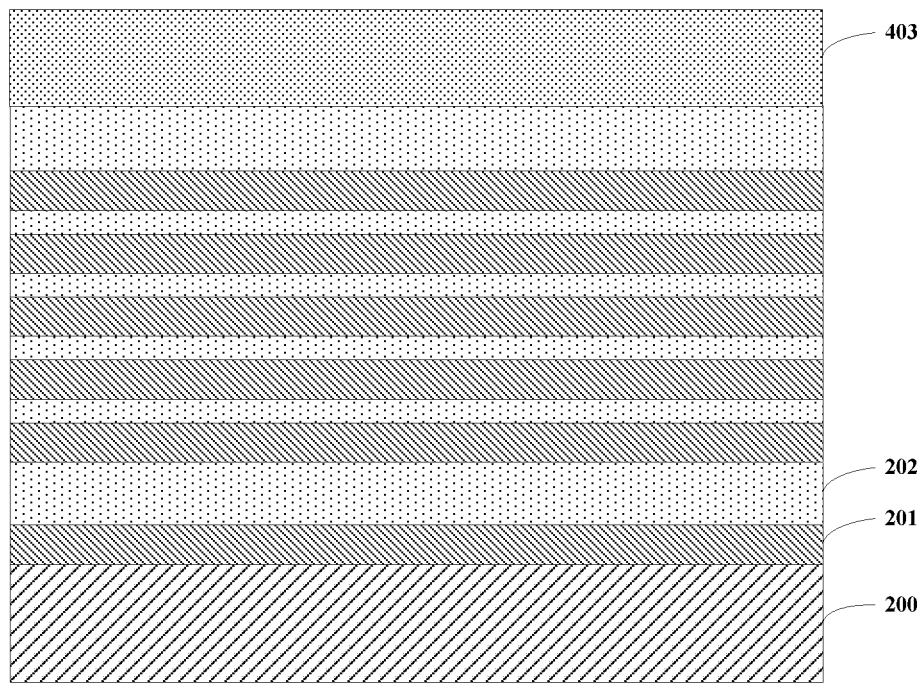

Referring to FIGS. 11A and 11B, after the pillar support component 210 is formed, a second dielectric layer 303 covering the pillar support component 210 is formed on the first dielectric layer 203. The second dielectric layer 303 may be made of silicon dioxide. Optionally, a planarization process, such as a Chemical Mechanical Planarization (CMP) process, may be conducted on the second dielectric layer 303. Here, FIG. 11B shows a cross-sectional view of the same structure of FIG. 11A on a cross-plane perpendicular to the paper and goes through line A-A' in FIG. 11A, and viewed along an arrow direction shown in FIG. 11A.

For convenience of this description, the first dielectric layer 203 and the second dielectric layer 204 together will be marked as a common dielectric layer 403 starting from FIG. 11B. This concludes the process to form a support structure in the first sacrificial layers 201 and the second sacrificial layers 202. As shown in those drawings, a plurality of pillar support components 210 may be formed, this description focus on the process to form only one pillar support component 210 with an understanding that other pillar support components may be formed by the same process. Three pillar support components 210 are exemplarily displayed in FIG. 11A, it should be understood that the exact number of pillar support components may vary depending on actual requirements and is not limited herein.

Figure 12A:
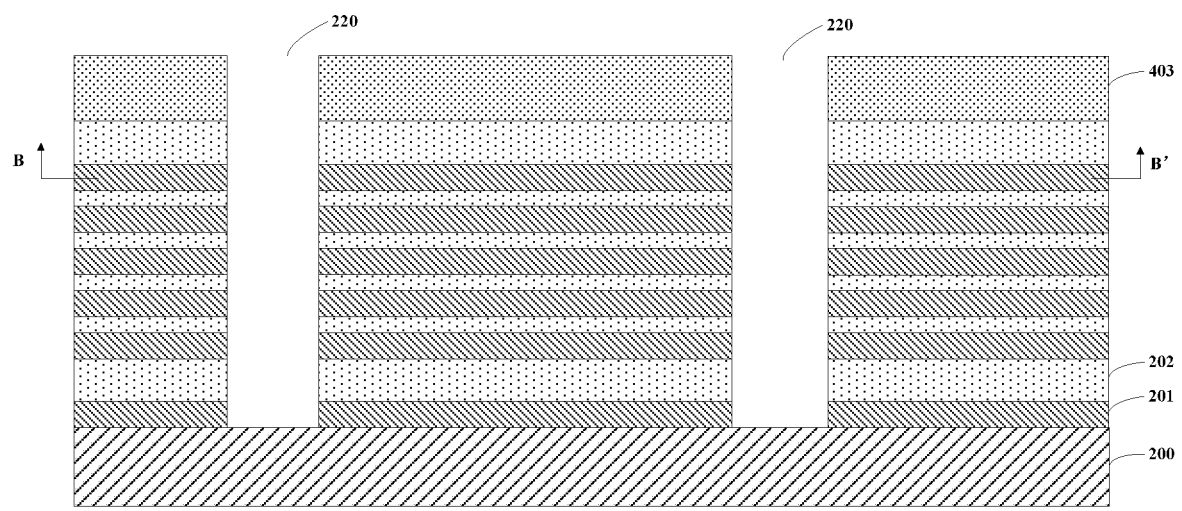

Referring to FIG. 12A, a first through-hole 220 exposing the upper surface of the substrate 200 is formed by etching the first sacrificial layers 201 and the second sacrificial layers 202. If the common dielectric layer 403 has been formed in preceding stages, forming a first through-hole 220 also comprises etching the common dielectric layer 403.

Figure 12B:
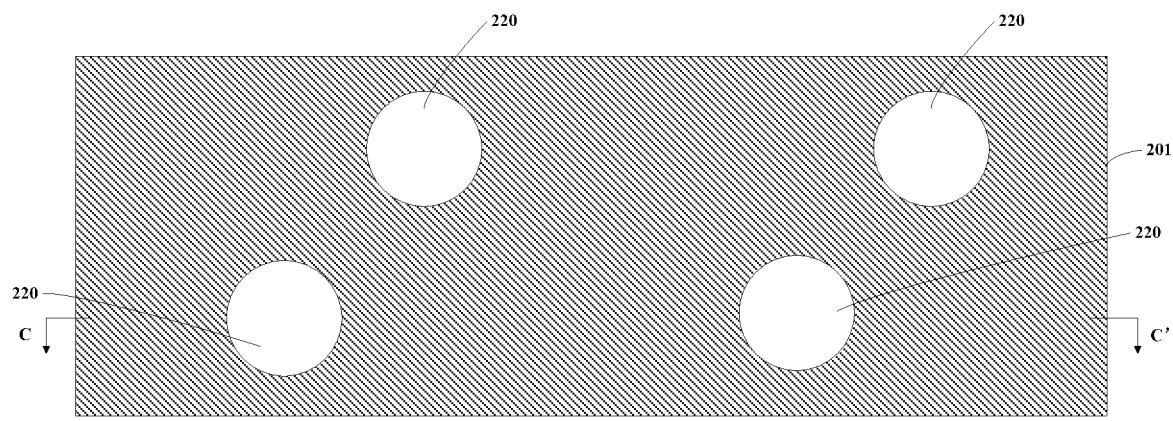

FIG. 12B shows a cross-sectional view of the same structure of FIG. 12A on a cross-plane perpendicular to the paper and goes through line B-B' in FIG. 12A, and viewed along an arrow direction shown in FIG. 12A. Referring to FIG. 12B, in one embodiment, a plurality of first through-holes 220 may be formed and these first through-holes 220 may be arranged staggeringly. FIG. 12A shows a cross-sectional view of the same structure of FIG. 12B on a cross-plane perpendicular to the paper and goes through line C-C' in FIG. 12B, and viewed along an arrow direction shown in FIG. 12B. FIG. 12A only shows two first through-holes 220 on the bottom of FIG. 12B, but not two first through-holes 220 on the top of FIG. 12B. It should be understood that the number of the first through-holes 220 in FIGS. 12A and 12B is exemplary and is not intended to limit the scope of this inventive concept.

Figure 13A:
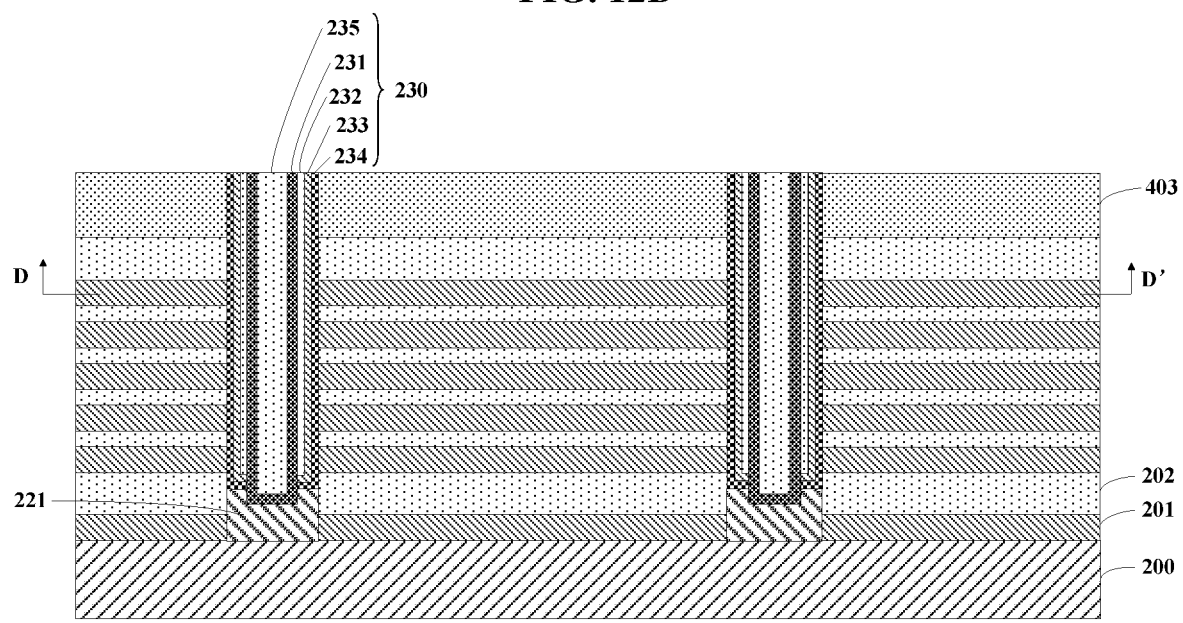
Figure 13B:
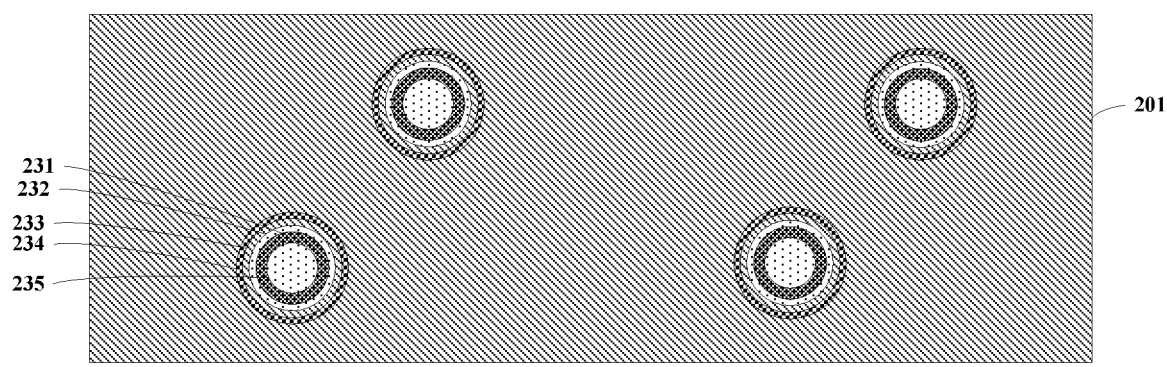

Referring to FIGS. 13A and 13B, a channel structure 230 is formed in the first through-hole 220. The process to form a channel structure 230 may comprise: epitaxially growing an epitaxy component 221 on the bottom of the first through-hole 220; and forming the channel structure 230 on the epitaxy component 221. As an example, this process may comprise: depositing an anti-etching layer 234 on a side surface and the bottom of the first through-hole 220, wherein the anti-etching layer 234 is also on the epitaxy component 221 and may be made of an HTO; depositing a charge capture layer 233 on the anti-etching layer 234; and depositing an insulation layer 232 on the charge capture layer 233. Referring to FIG. 13A, optionally, a portion of the insulation layer 232, a portion of the charge capture layer 233, a portion of the anti-etching layer 234 on the epitaxy component 221, and a portion of the epitaxy component 221 may be etched away to form an epitaxy cavity in the epitaxy component 221, then a channel layer 231 may be deposited on the epitaxy component 221 and on a side surface of the insulation layer 232. Optionally, a channel kernel 235 filling the first through-hole 220 may be formed on the channel layer 231. The channel kernel 235, the channel layer 231, the insulation layer 232, the charge capture layer 233, and the anti-etching layer 234 form the channel structure 230.

Referring to FIG. 13B, in one embodiment, each of the first through-holes may have a channel structure 230 formed in it, so that there would be a plurality of channel structures 230 formed in the first sacrificial layers 201 and the second sacrificial layers 202, these channel structures 230 may be arranged staggeringly, as shown in FIG. 13B.

Figure 14:
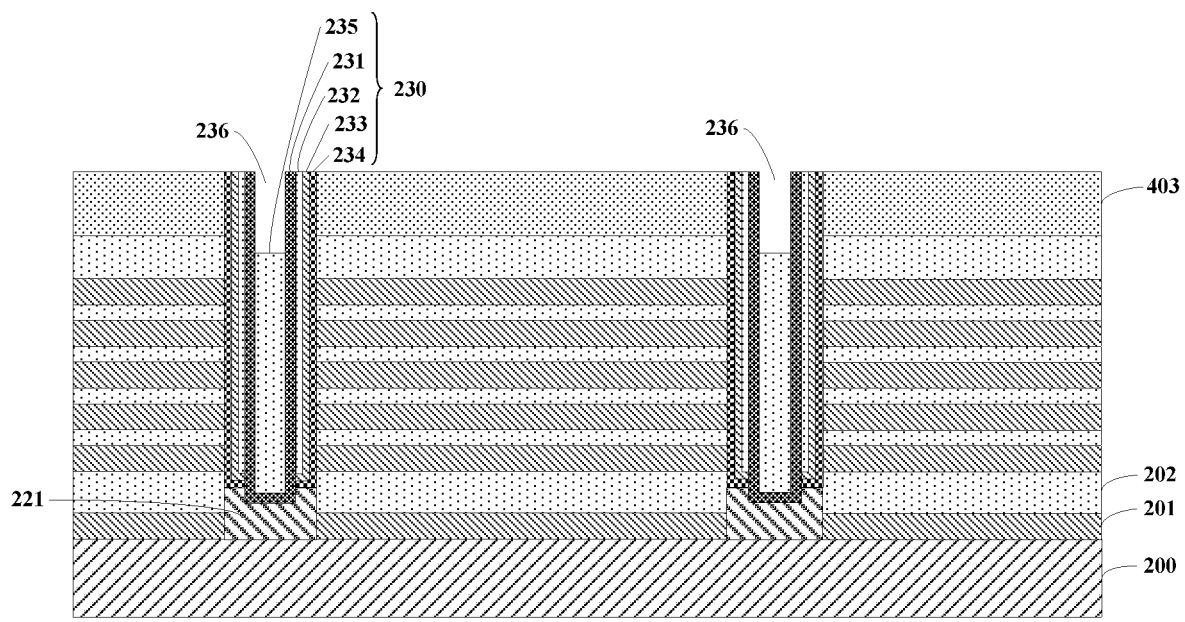

Referring to FIG. 14, optionally, the process to form a channel structure 230 may further comprise: etching back the channel kernel 235 to form a kernel cavity 236.

Figure 15:
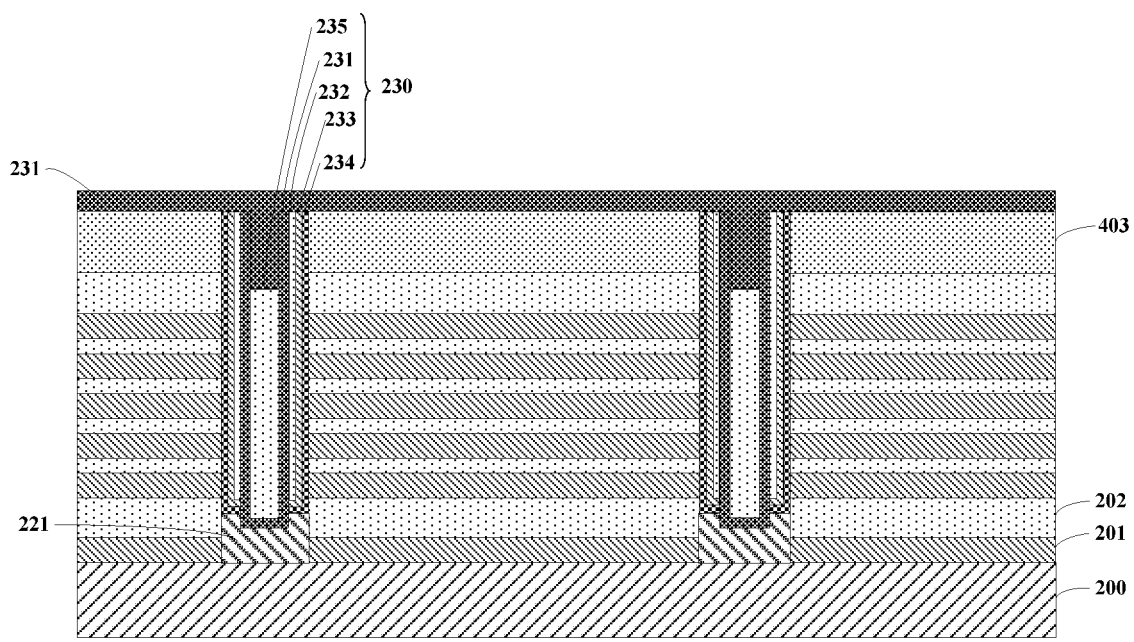

Referring to FIG. 15, optionally, the process to form a channel structure 230 may further comprise: depositing the channel layer 231 filling the kernel cavity 236 so that the channel layer 231 is on the channel kernel 235.

Figure 16:
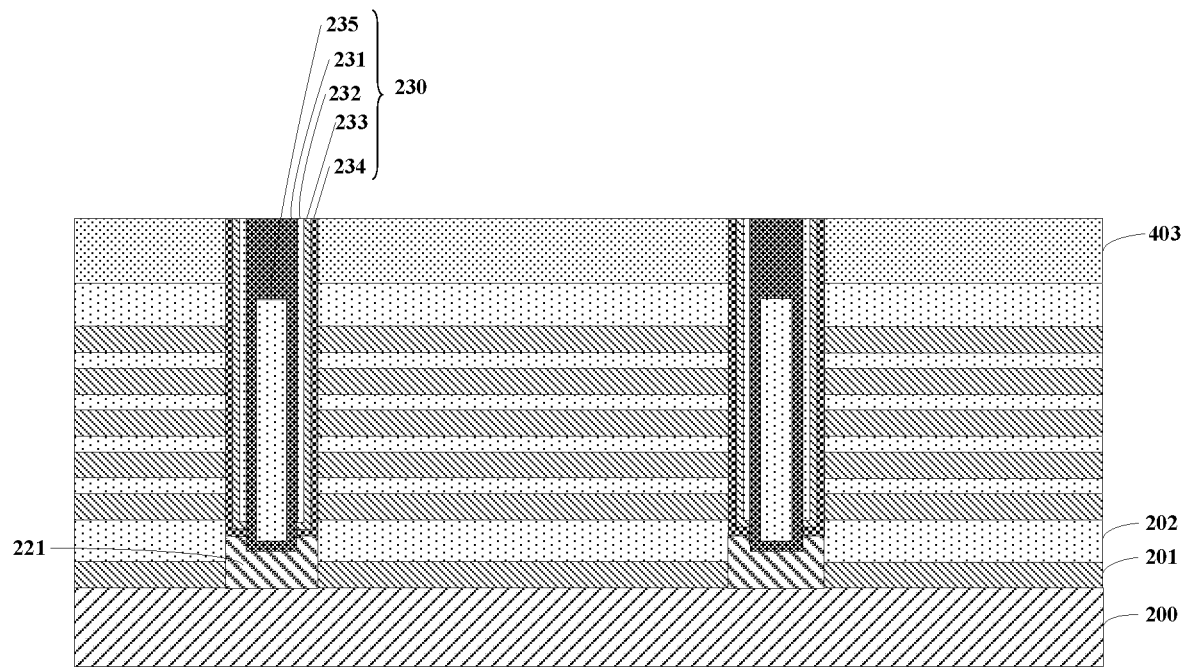

Referring to FIG. 16, optionally, the process to form a channel structure 230 may further comprise: removing a portion of the channel layer 231 on the common dielectric layer 403 to form the channel structure 230 as shown in FIG. 16. Optimally, in the channel structure 230 of FIG. 16, the channel layer 231 also covers an upper surface of the channel kernel 235, which makes it easy to form a channel contact component connecting to the channel layer in the succeeding stages.

Figure 17:
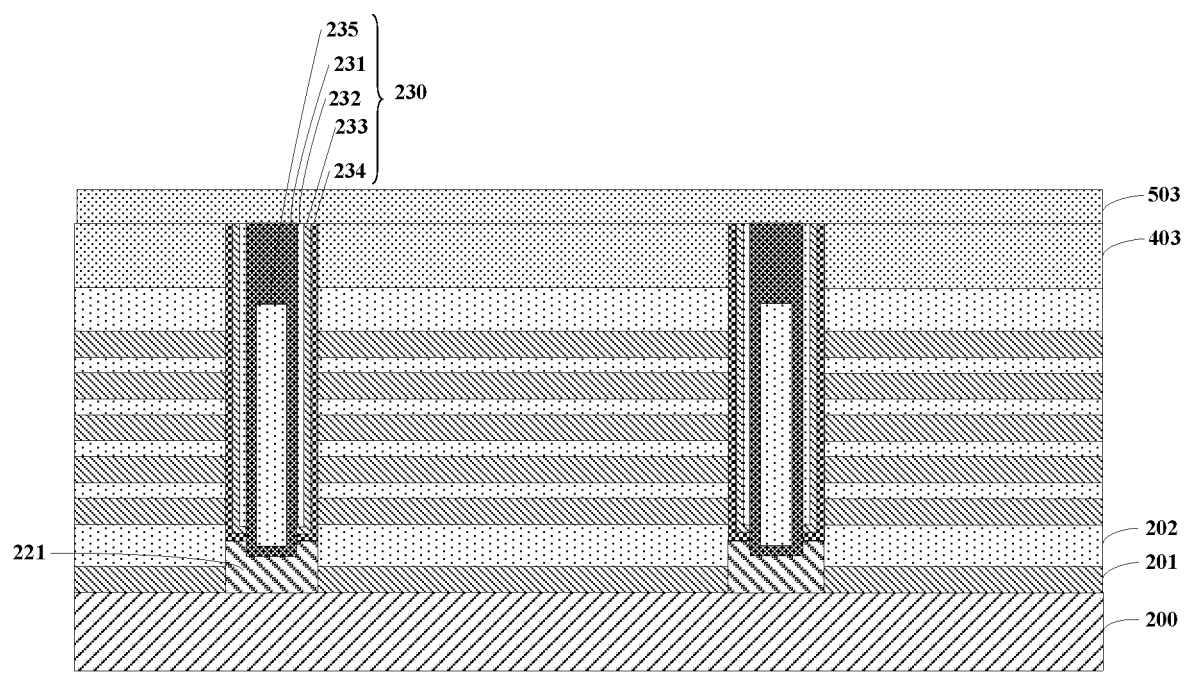

Referring to FIG. 17, optionally, a third dielectric layer 503 covering the channel structure 230 may be deposited on the common dielectric layer 403.

Figure 18A:
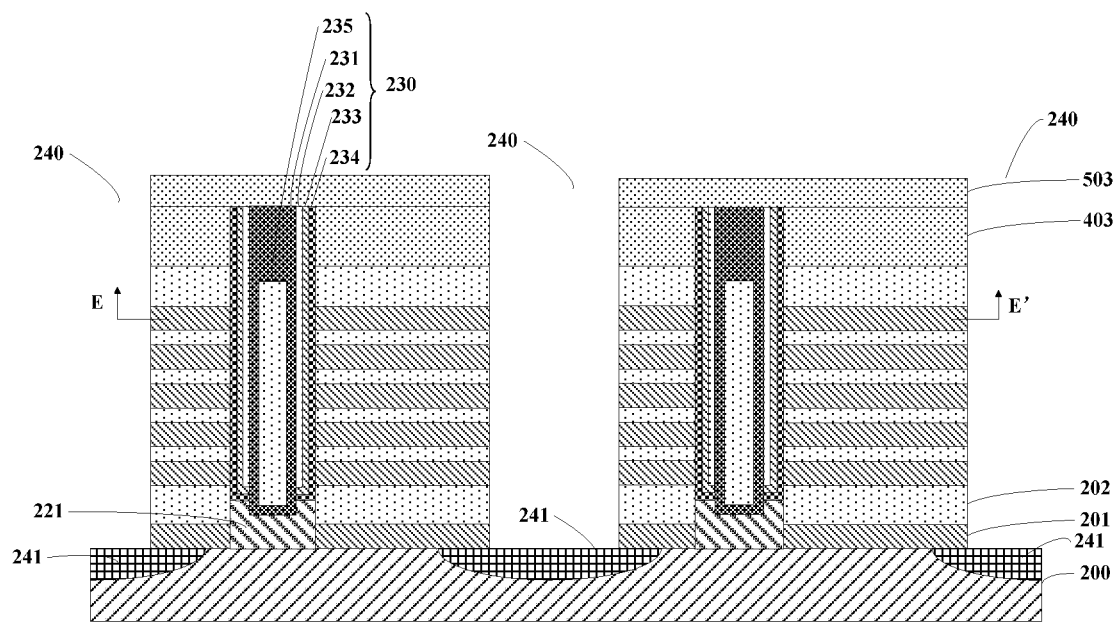
Figure 18B:
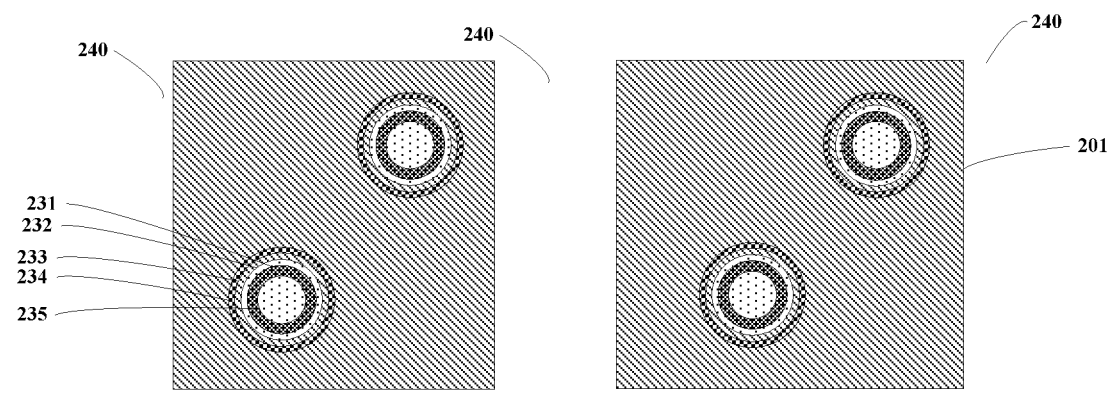

Referring to FIGS. 18A and 18B, after the channel structure 230 is formed, a groove 240 exposing the upper surface of the substrate 200 is formed by etching the first sacrificial layers 201 and the second sacrificial layers 202. FIG. 18B shows a cross-sectional view of the same structure of FIG. 18A on a cross-plane perpendicular to the paper and goes through line E-E' in FIG. 18A, and viewed along an arrow direction shown in FIG. 18A. If the common dielectric layer 403 (comprising the first dielectric layer 203 and the second dielectric layer 303) and the third dielectric layer 503 have been formed in preceding stages, forming a groove 240 further comprises etching the common dielectric layer 403 and the third dielectric layer 503. Referring to FIG. 18A, a doped region 241 is formed in the substrate 200 by doping a portion of the substrate 200 at the bottom of the groove 240, the doped region 241 may work as a source electrode or a drain electrode. The doping process may be conducted by ion implantation, and the doped region 241 may be an N-type doped region.

Figure 19:
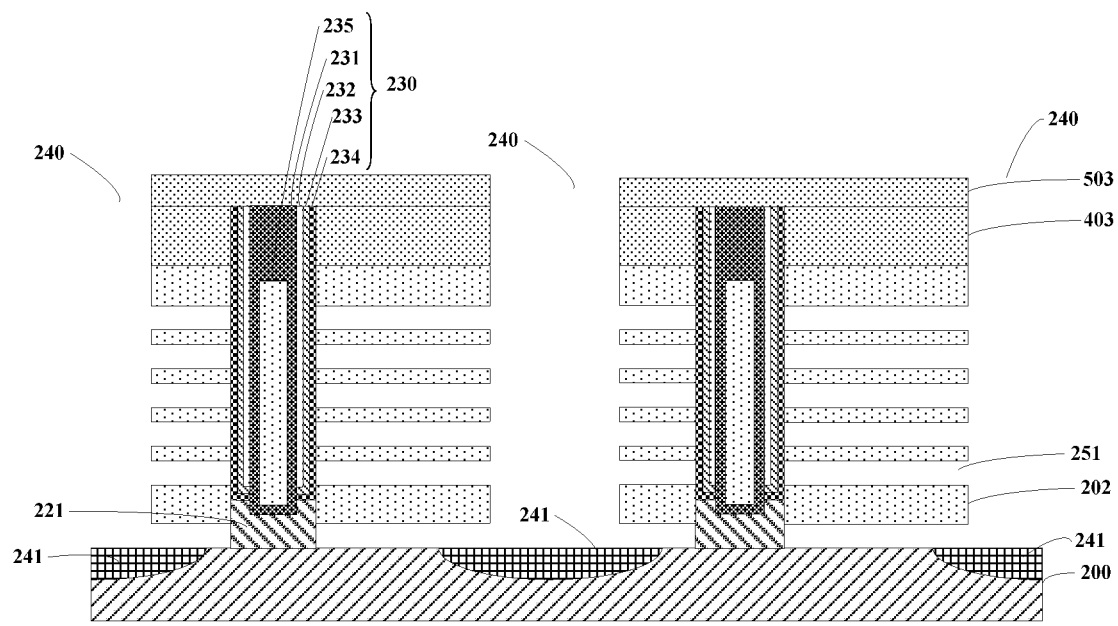

Referring to FIG. 19, a plurality of first cavities 251 are formed by removing the first sacrificial layers 201.

Figure 20:
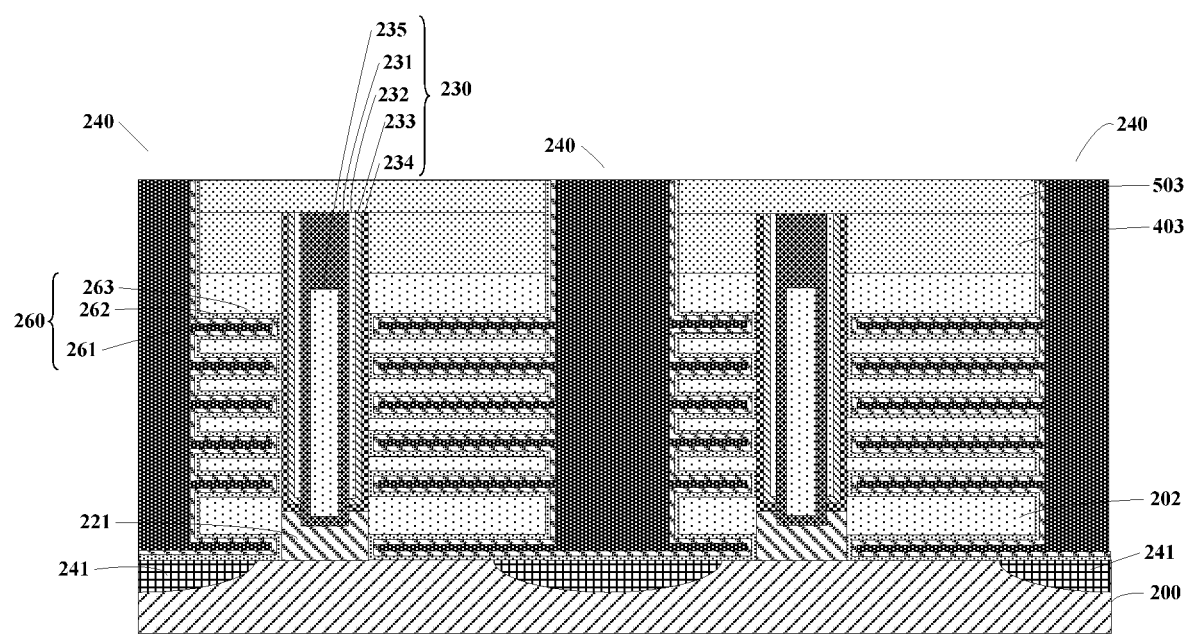

Referring to FIG. 20, a plurality of gate structures 260 are formed in the first cavities 251. Each of the gate structures 260 may comprise a gate 261, a work function regulation layer 262 on the surface of the gate 261, and a high-K dielectric layer 263 on the surface of the work function regulation layer 262. The gate 261 may be made of a metallic material such as tungsten, the work function regulation layer 262 may be made of titanium nitride (TiN), and the high-K dielectric layer 263 may be made of hafnium oxide ($HfO_2$).

Figure 21:
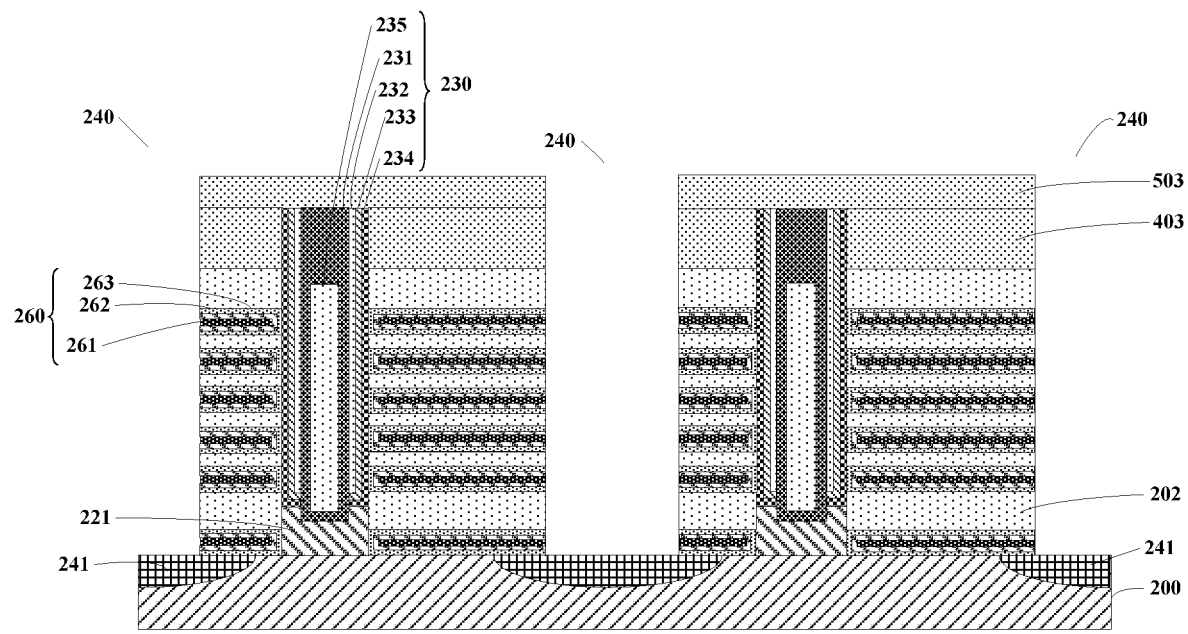

Referring to FIG. 20, in one embodiment, forming gate structures 260 in the first cavities 251 comprises: forming gate structures 260 in the first cavities 251 and the groove 240. Referring to FIG. 21, optionally, forming gate structures 260 in the first cavities 251 may further comprise: removing the gate structures 260 in the groove 240.

Figure 22:
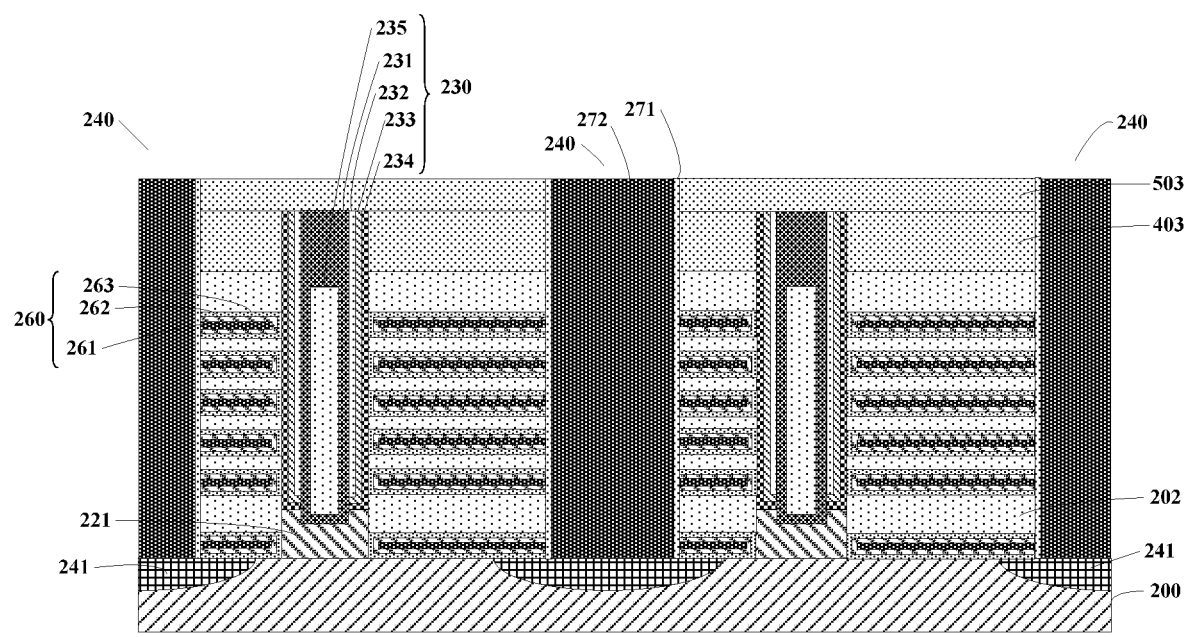

Referring to FIG. 22, after the gate structures 260 in the groove 240 have been removed, an interval layer 271 is formed on a side surface of the groove 240. After the interval layer 271 has been formed, a groove metal filling layer 272 filling the groove 240 and contacting the doped region 241 is formed on the substrate 200. In this embodiment, the interval layer 271 separates the groove metal filling layer 272 from the gate structures 260, and may be made of a silicon oxide that has a higher compactness than the material used for the second sacrificial layers 202.

Figure 23A:
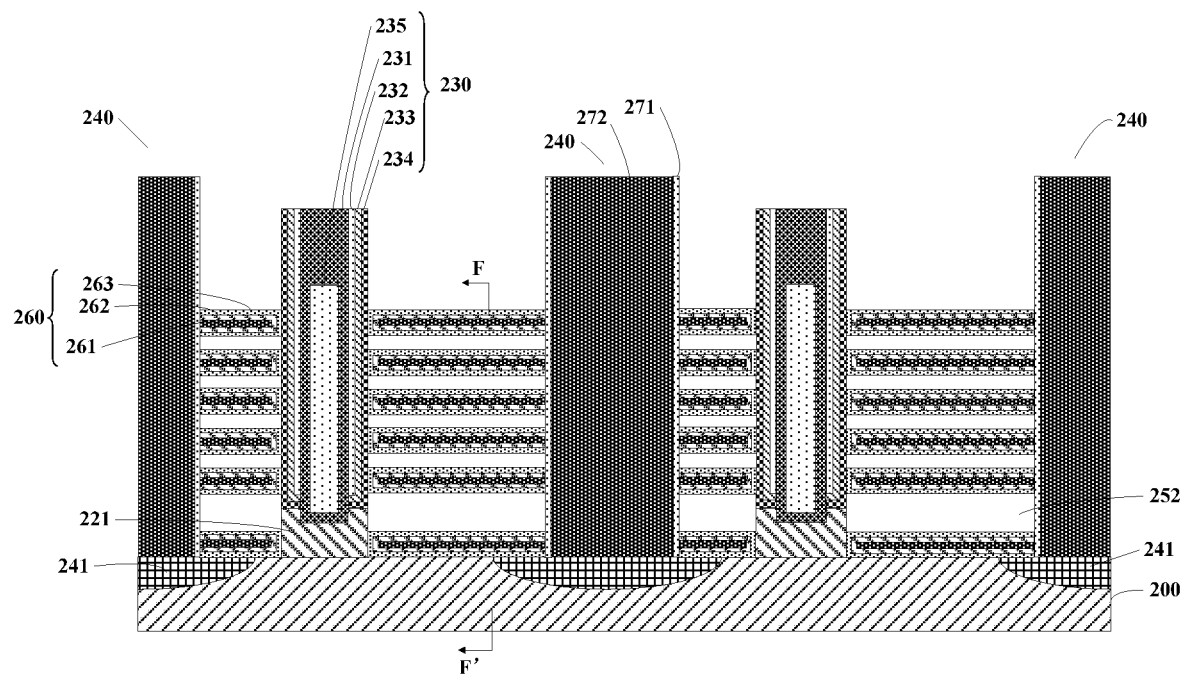
Figure 23B:
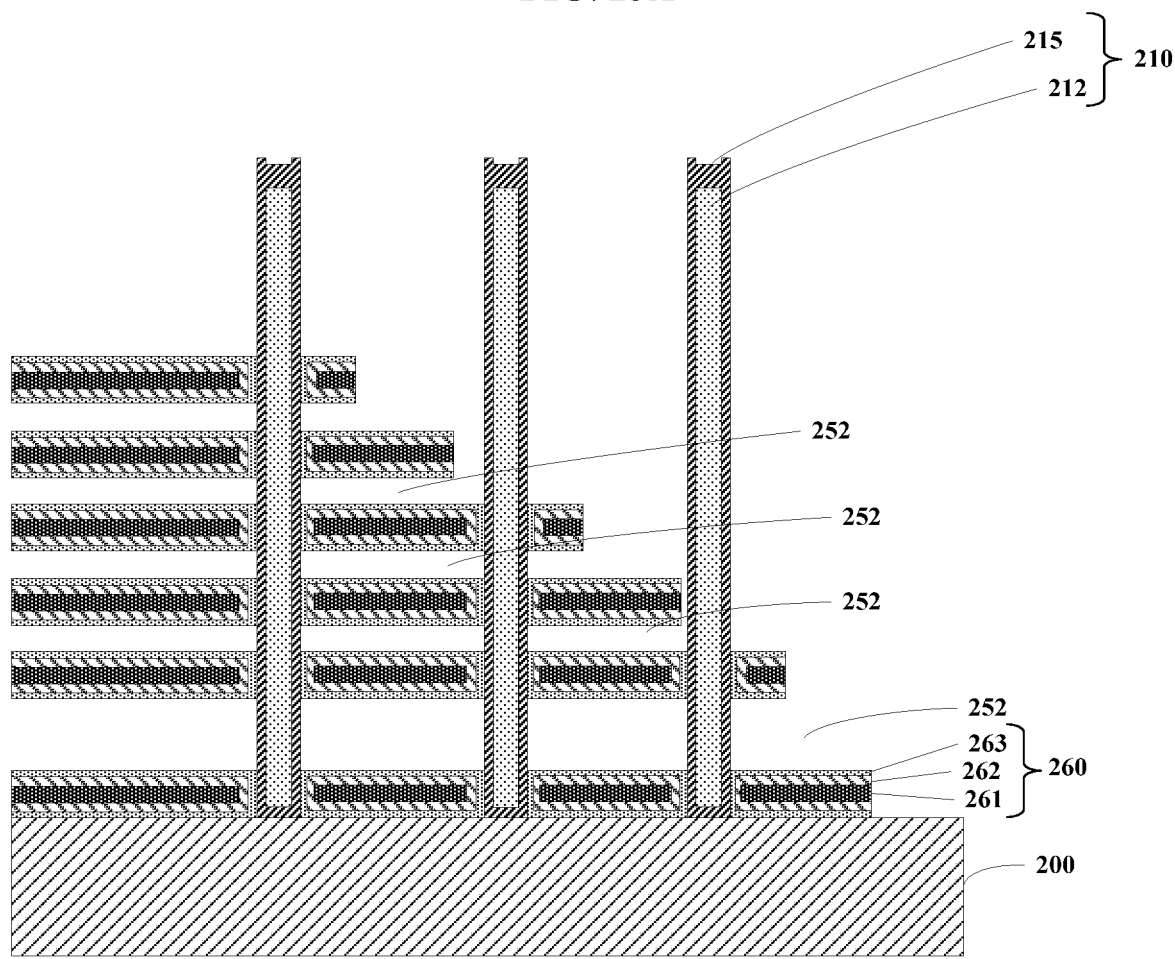

Referring to FIGS. 23A and 23B, a plurality of second cavities 252 are formed between neighboring gate structures 260 by removing the second sacrificial layers 202 with a dry etching or a wet etching process. The etching process used in this step has a slower removal rate to HTO than to the second sacrificial layers 202, hence the anti-etching layer 234 comprising HTO can protect various layers of the channels structure 230, such as the charge capture layer 233, from being damaged during this etching process.

Here, FIG. 23B shows a cross-sectional view of the same structure of FIG. 23A on a cross-plane perpendicular to the paper and goes through line F-F' in FIG. 23A, and viewed along an arrow direction shown in FIG. 23A. Referring to FIG. 23B, the gate structures 260 may form a staircase pattern. When removing the second sacrificial layers 202, the common dielectric layer 403 (comprising the first dielectric layer 203 and the second dielectric layer 303) and the third dielectric layer 503 will also be removed. The support structure, including a plurality of pillar support components 210, will provide structural reinforcement to the gate structures 260 and prevent them from collapsing after these layers are removed.

In some embodiments, the interval layer 271 may have a higher compactness than the second sacrificial layers 202, the common dielectric layer 403, and the third dielectric layer 503. Hence, with a proper etching process, the interval layer 271 may remain intact when the second sacrificial layers 202, the common dielectric layer 403 and the third dielectric layer 503 are removed.

Referring to FIGS. 24A, 24B, 25A, 25B, 26A, and 26B, a process to form gate contact components will be described below.

Figure 24A:
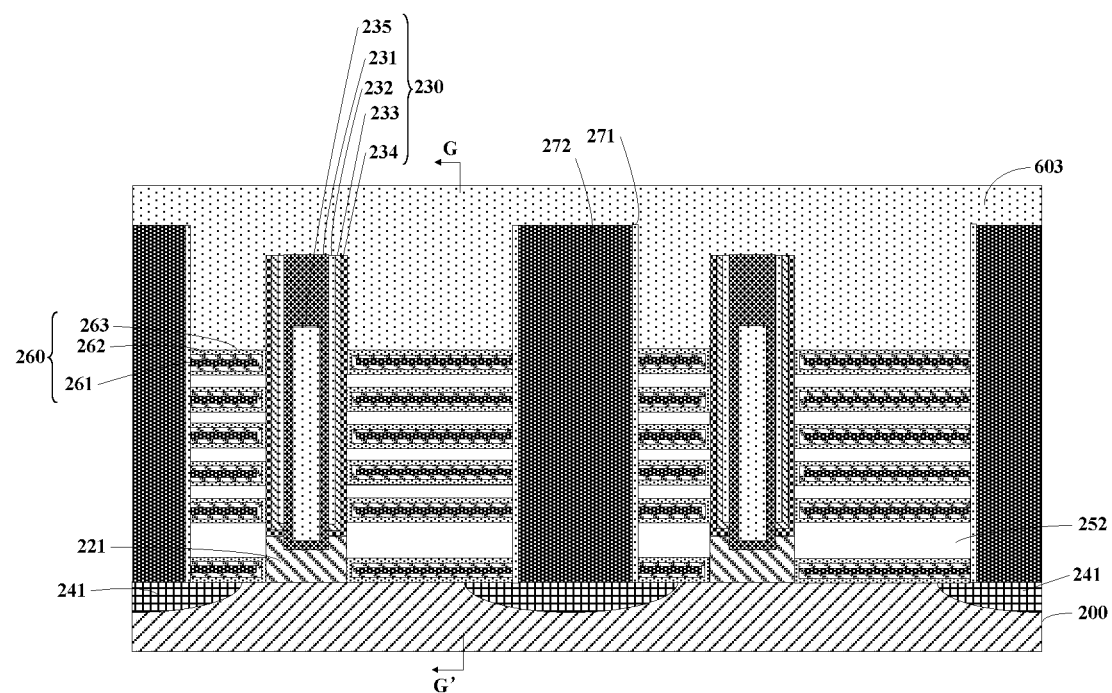
Figure 24B:
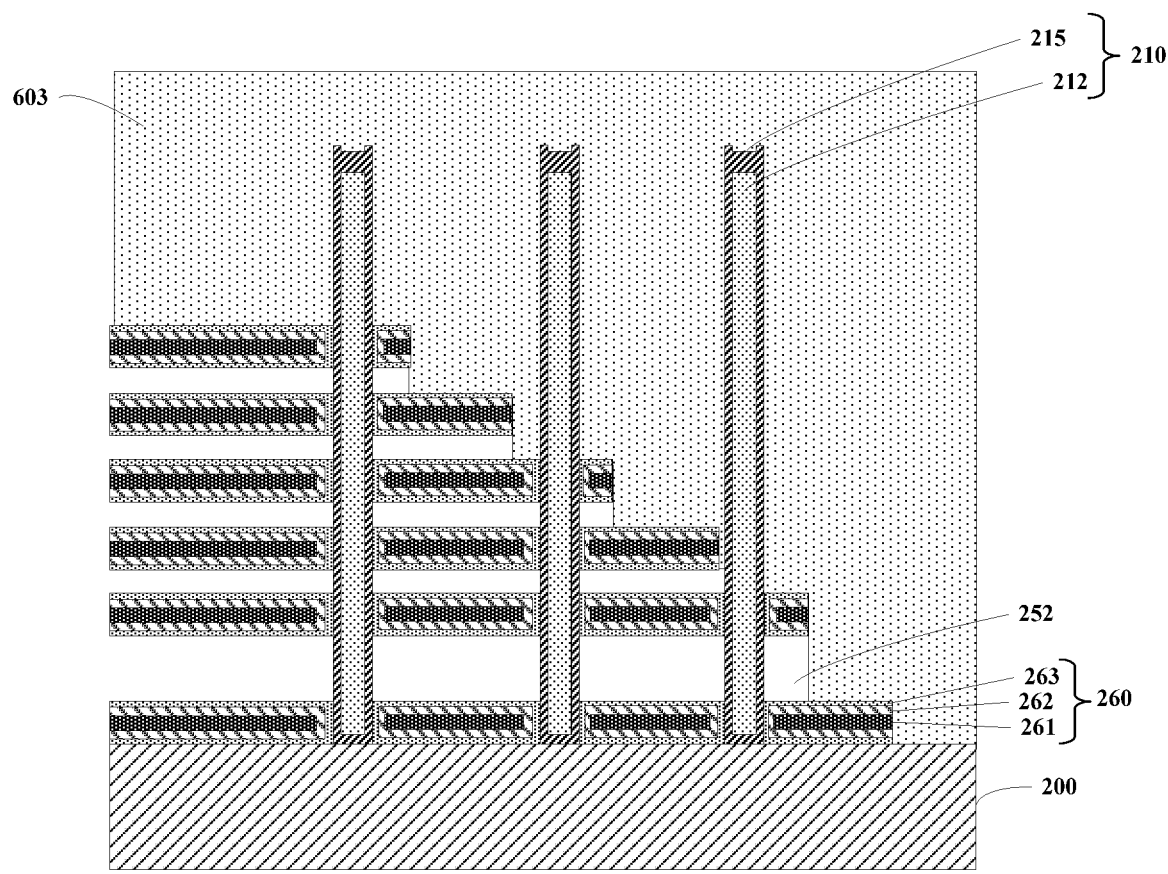

Referring to FIGS. 24A and 24B, in one embodiment, forming gate contact components may comprise: forming an inter-layer dielectric layer 603 wrapped around the support structure on the gate structures 260. The inter-layer dielectric layer 603 may be made of silicon dioxide. FIG. 24B shows a cross-sectional view of the same structure of FIG. 24A on a cross-plane perpendicular to the paper and goes through line G-G' in FIG. 24A, and viewed along an arrow direction shown in FIG. 24A.

Figure 25A:
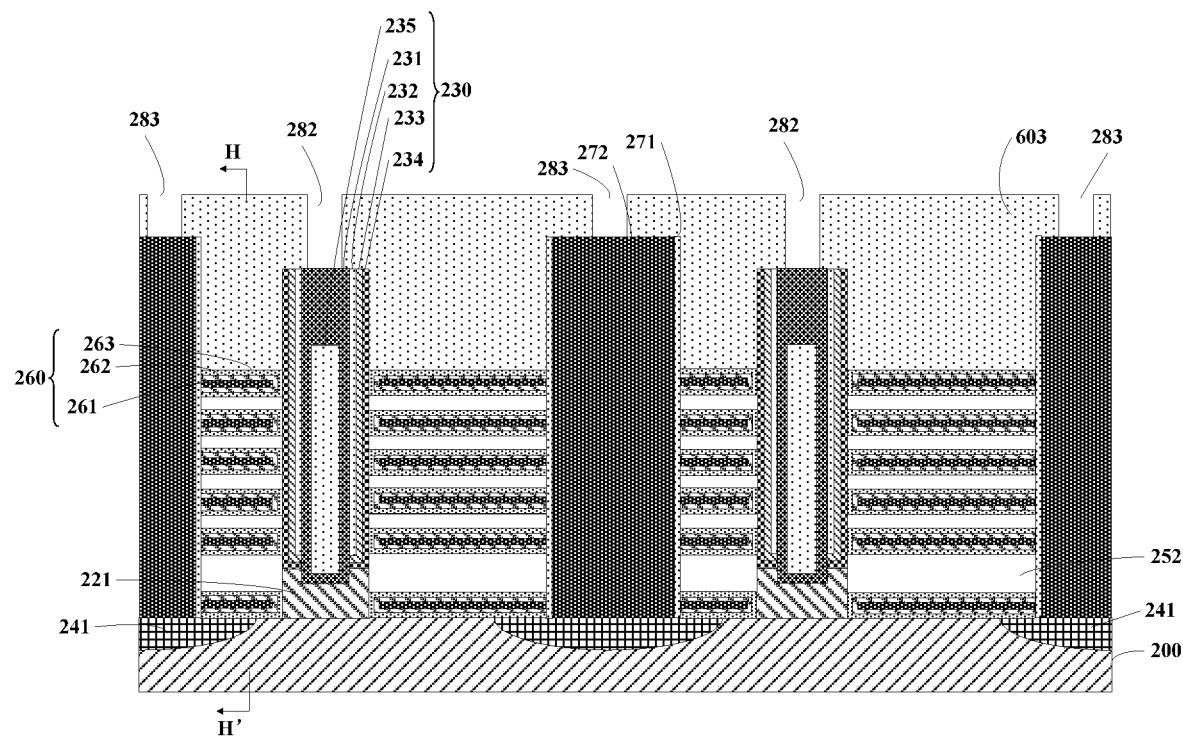
Figure 25B:
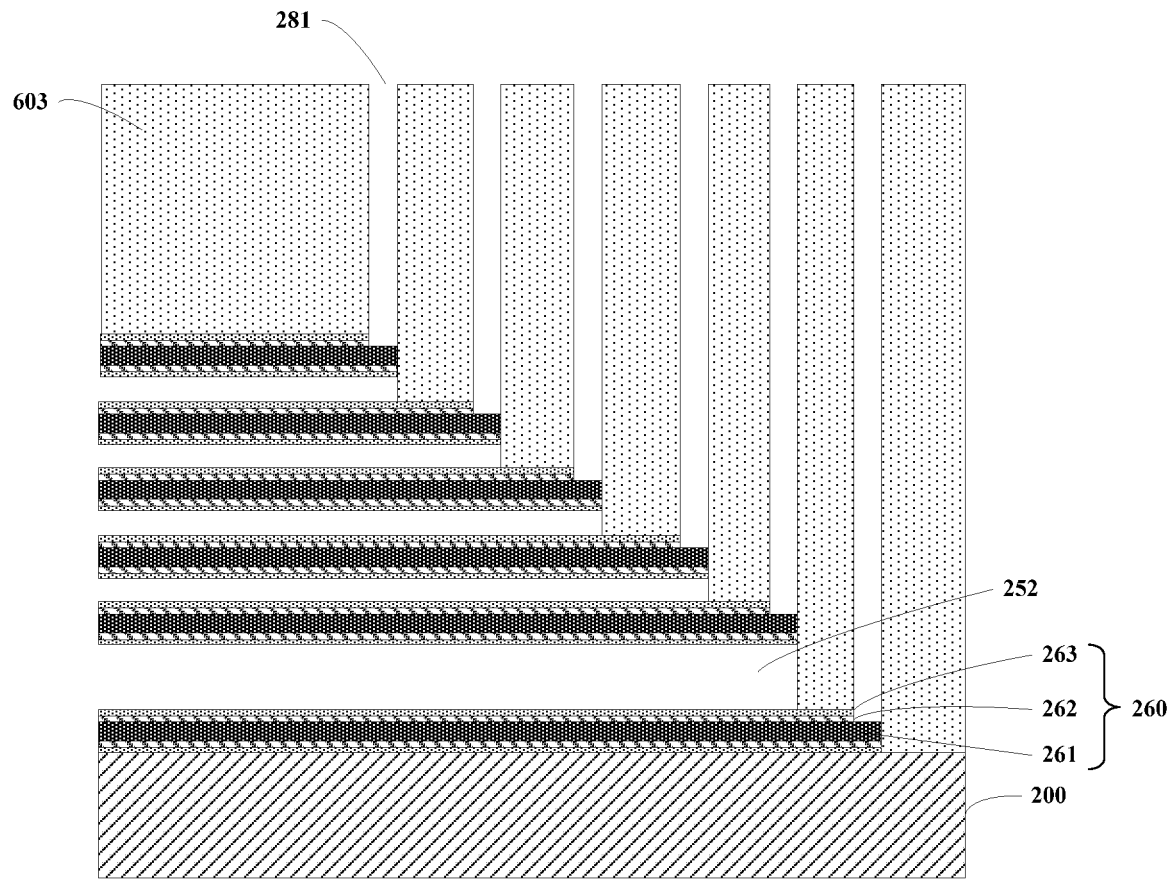

Referring to FIG. 25B, forming gate contact components may further comprise: forming second through-holes 281 exposing the gate structures 260 by etching the inter-layer dielectric layer 603. The second through-holes 281 may expose the gate 261 of the gate structures 260. Referring to FIG. 25A, in one embodiment, a third through-hole 282 exposing the channel layer 231 and a fourth through-hole 283 exposing the groove metal filling layer 272 may also be formed. FIG. 25B shows a cross-sectional view of the same structure of FIG. 25A on a cross-plane perpendicular to the paper and goes through line H-H' in FIG. 25A, and viewed along an arrow direction shown in FIG. 25A.

Since FIGS. 24B and 25B are cross-sectional views observed on different cross-planes, the pillar support components 210 shown on FIG. 24B are not displayed on FIG. 25B. These drawings are example views only. In some embodiments, the second through-holes 281 connecting to the staircase pattern may be formed in a location so that it will be displayed in FIG. 24B, together with the pillar support components 210. Since the width of each step of the staircase pattern is relatively large (around 500 nm), there is room for sufficient separation between second through-holes 281 and the pillar support components 210.

Figure 26A:
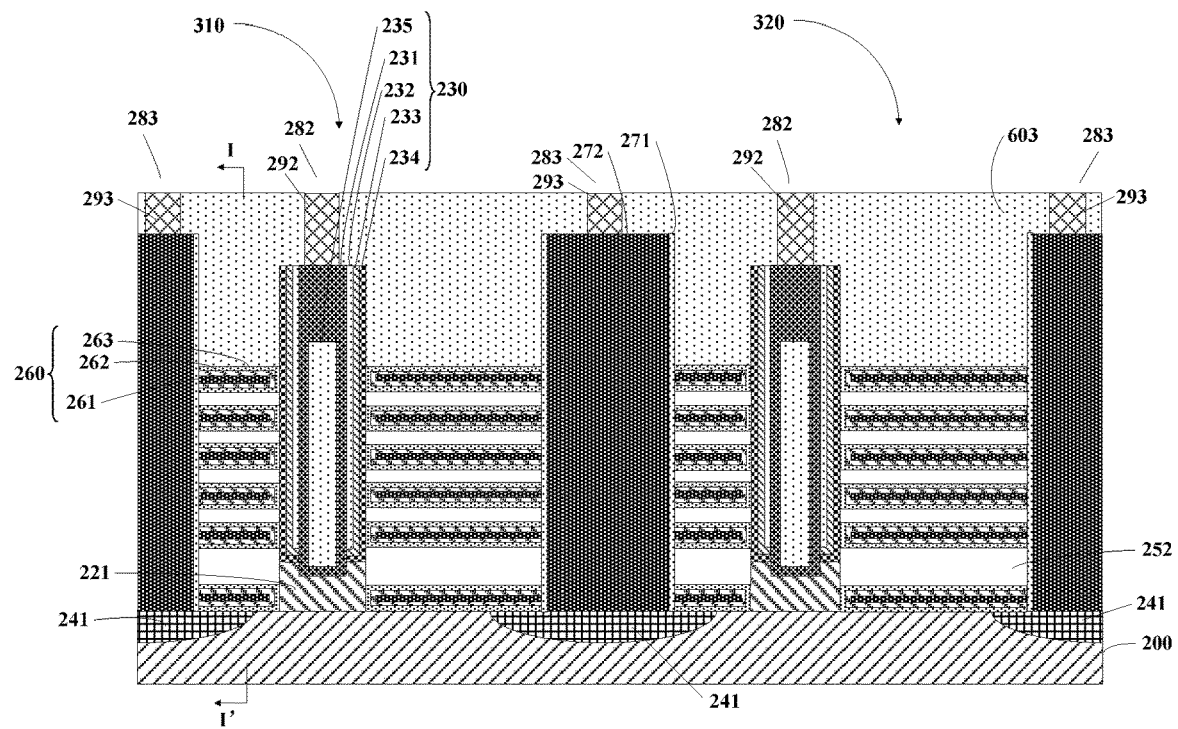
Figure 26B:
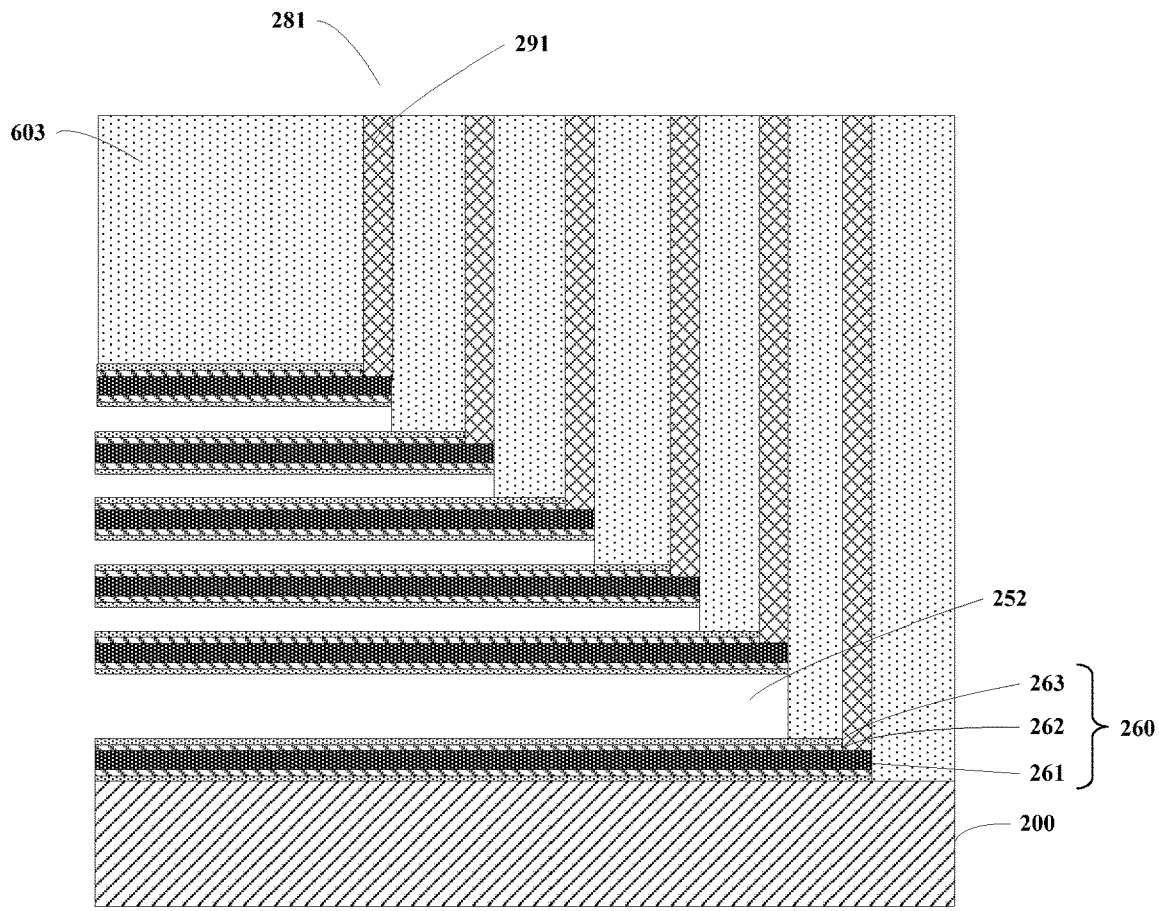

Referring to FIG. 26B, forming gate contact components may further comprise forming a gate contact component 291 in each of the second through-holes 281. The gate contact components 291 may be made of a metallic material such as copper or tungsten. Referring to FIG. 26B, in one embodiment, the gate structures 260 form a staircase pattern and each of the gate contact components 291 contacts the gate 261 of a corresponding gate structure 260 at a step of the staircase pattern. In one embodiment, each of the pillar support components 210 is also located on a step of the staircase pattern and separating from the gate contact components 291. FIG. 26B shows a cross-sectional view of the same structure of FIG. 26A on a cross-plane perpendicular to the paper and goes through line I-F in FIG. 26A, and viewed along an arrow direction shown in FIG. 26A.

Referring to FIG. 26A, in one embodiment, when forming gate contact components, a channel contact component 292 may be formed in the third through-hole 282 and a groove contact component 293 may be formed in the fourth through-hole 283. The channel contact component 292 and the groove contact component 293 may be made of a metallic material such as copper or tungsten.

This concludes the description of the above description pertains to a flash memory manufacturing method in accordance with one or more embodiments of this inventive concept.

This inventive concept further presents a flash memory device. This flash memory device will be described below in reference to FIGS. 24B, 26A, and 26B.

Referring to FIG. 26A, this flash memory device comprises a substrate 200 and a memory unit on the substrate 200. The embodiment of FIG. 26A shows two memory units, annotated as a first memory unit 310 and a second memory unit 320. The exact number of memory units in a flash memory device may vary depending on actual requirements and is not limited herein. Since the two memory units have similar structures, the description will focus on the first memory unit 310 only.

Referring to FIG. 26A, the memory unit, such as the first memory unit 310, may comprise a channel structure 230 on the substrate 200. The channel structure 230 comprises, in an order from inner to outer of the channel structure, a channel layer 231, an insulation layer 232 wrapped around the channel layer 231, and a charge capture layer 233 wrapped around the insulation layer 232. In one embodiment, the channel structure 230 may further include an anti-etching layer 234 wrapped around the charge capture layer 233. The anti-etching layer 234 may be made of a HTO. As an example, this HTO may be a silicon oxide formed in a temperature range from 300 to 500 Celsius degree (e.g. 400 Celsius degree). In one embodiment, the channel structure 230 may further comprise a channel kernel 234 surrounded by the channel layer 231. The channel kernel 234 may be made of silicon dioxide. In one embodiment, the memory unit may comprise a plurality of channel structures arranged in gate structures.

In one embodiment, the insulation layer 232 and the charge capture layer 233 may completely wrap around the surfaces of the channel layer 231 that is perpendicular to the top surface of the substrate 200. In another embodiment, the insulation layer 232 and the charge capture layer 233 may partially wrap around those surfaces of the channel layer 231.

Referring to FIG. 26A, the memory unit, such as the first memory unit 310, may further comprise a plurality of gate structures 260 wrapped around the channel structure 230 and arranged along an axis of symmetry that extends through the channel structure 230, and a plurality of cavities 252 (the second cavities in previous description) between neighboring gate structures 260. The axis of symmetry of the channel structure 230 is an axis along which the channel structure 230 extends, which is also a direction along which a work current flows in the channel layer 231 when powered on. As an example, in some embodiments, the axis of symmetry of the channel structure 230 is substantially perpendicular to an upper surface of the substrate 200. In one embodiment, each of the gate structures 260 may comprise: a gate 261, a work function regulation layer 262 on the surface of the gate 261, and a high-K dielectric layer 263 on the surface of the work function regulation layer 262. A first portion of the high-K dielectric layer 263 is located between the gate 261 and the channel structure 230, and a second portion of the high-K dielectric layer 263 is located between the gate 361 and pillar support components 210, as shown in FIG. 24B. The exact number of the gate structures 360 may vary depending on actual requirements and is not limited herein. As an example, the number may be any number between 32 and 128.

Referring to FIG. 24B, the memory unit, such as the first memory unit 310, may further comprise a support structure supporting the gate structures 260. As an example, the support structure may comprise at least one pillar support component 210. The pillar support component 210 may comprise a pillar kernel 212 and a common cover layer 215 wrapped around the pillar kernel 212. The pillar kernel 212 may be made of silicon dioxide and the common cover layer 215 may be made of undoped polycrystalline silicon. The support structure may be located on either the middle or the edge of the entire structure comprising the memory unit.

Referring to FIG. 26B, the memory unit, such as the first memory unit 310, may further comprise a plurality of gate contact components 291 each connecting to one gate structure 260. As an example, the gate contact component 291 may contact the gate 261 of the corresponding gate structure 260. Referring to FIG. 26B, in one embodiment, the gate structures 260 form a staircase pattern, and each of the gate contact components 291 contacts the gate 261 of a corresponding gate structure 260 at a step of the staircase pattern. Referring to FIG. 24B, the pillar support component 210 may also locate at a step of the staircase pattern and separating from the gate contact components 291.

Referring to FIG. 26A, in one embodiment, the memory unit, such as the first memory unit 310, may further comprise a channel contact component 292 connecting to the channel layer 231.

Referring to FIG. 26A, in one embodiment, the flash memory device of this inventive concept may comprise a plurality of memory units separated from each other. A groove metal filling layer 272 and an interval layer 271 may be formed between neighboring memory units on the substrate 200, wherein the interval layer 271 separating the groove metal filling layer 272 from the gate structures 260.

Referring to FIG. 26A, in one embodiment, the substrate 200 may comprise a doped region 241 in the substrate 200 contacting the groove metal filling layer 272.

Referring to FIG. 26A, in one embodiment, the flash memory device of this inventive concept may further comprise a groove contact component 293 connecting to the groove metal filling layer 272.

Referring to FIGS. 24B and 26B, the flash memory device of this inventive concept may further comprise an inter-layer dielectric layer 603 around the support structure and the gate contact components 291 on the gate structures 260. Referring to FIG. 26A, the inter-layer dielectric layer 603 may also wrap the groove contact component 293 and the channel contact component 292.

In one embodiment, the flash memory device of this inventive concept may further comprise an epitaxy component 221 on the substrate 200, wherein the channel structure 230 is on the epitaxy component 221.

The working mechanism of the flash memory device of this inventive concept is similar to that of a conventional 3D NAND flash memory and will be briefly described below. To write a data into the flash memory, one of the groove contact component 293 and the channel contact component 292 is grounded, with the other connecting to a positive voltage source, which results in a working current flowing in the channel layer 231 of the channel structure 230. At this time, if a gate voltage is applied to a gate structure wrapped around the channel structure 230, the charge carriers, such as electrons, will tunnel through the insulation layer and reach the charge capture layer to realize data writing.

In the flash memory device of this inventive concept, the cavities in neighboring gate structures lower the parasitic capacitance, reduce inter-gate interference, and suppress the influence from writing or erasing operations of nearby memory units.

As an example, due to a smaller dielectric constant of air than silicon dioxide, a 3D NAND flash memory device with the cavities filled with air has a smaller parasitic capacitance than those of its conventional counterparts.

Additionally, the support structure formed in this flash memory device provides structural reinforcement to the gate structures, which may be weakened by the cavities, and prevents them from collapsing.

This above description pertains to a flash memory device in accordance with one or more embodiments of this inventive concept.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A method for manufacturing a flash memory device, comprising:
   providing a substrate;
   forming a plurality of first sacrificial layers and a plurality of second sacrificial layers stacked in an alternating manner, wherein the first sacrificial layers contain material that is different from the second sacrificial layers;
   forming a support structure in the first sacrificial layers and the second sacrificial layers, wherein the support structure comprises at least one pillar support component, wherein the pillar support component comprises a common cover layer and a pillar kernel, wherein the common cover layer is made of undoped silicon, directly contacts at least two of the first sacrificial layers, and directly contacts at least two of the second sacrificial layers, and wherein the pillar kernel is solid, is positioned inside the common cover layer, and is made of a material different from the undoped silicon;
   forming a first through-hole exposing an upper surface of the substrate by etching the first sacrificial layers and the second sacrificial layers;
   forming a channel structure in the first through-hole, wherein the channel structure comprises, in an order from inner to outer of the channel structure, a channel layer, an insulation layer wrapped around the channel layer, and a charge capture layer wrapped around the insulation layer;
   forming a plurality of first cavities by removing the first sacrificial layers;
   forming a plurality of gate structures in the first cavities;
   forming a plurality of second cavities between neighboring gate structures by removing the second sacrificial layers; and
   forming a plurality of gate contact components each connecting to a gate structure.

2. The method of claim 1, wherein the first sacrificial layers are made of silicon nitride and the second sacrificial layers are made of silicon dioxide.

3. The method of claim 1, wherein the channel structure further comprises an anti-etching layer wrapped around the charge capture layer.

4. The method of claim 3, wherein the anti-etching layer is made of a High Temperature Oxide (HTO), wherein the HTO is a silicon oxide formed in a temperature range from 300 degrees Celsius to 500 degrees Celsius.

5. The method of claim 1, wherein the pillar kernel is positioned between two portions of the common cover layer in a direction perpendicular to the substrate.

6. A method for manufacturing a flash memory device, comprising:
   providing a substrate;
   forming a plurality of first sacrificial layers and a plurality of second sacrificial layers stacked in an alternating manner, wherein the first sacrificial layers contain material that is different from the second sacrificial layers;

forming a support structure in the first sacrificial layers and the second sacrificial layers, wherein the support structure comprises at least one pillar support component, wherein the pillar support component comprises a common cover layer and a pillar kernel, wherein the common cover layer is made of polycrystalline silicon, directly contacts at least two of the first sacrificial layers, directly contacts at least two of the second sacrificial layers, and is wrapped around the pillar kernel;

forming a first through-hole exposing an upper surface of the substrate by etching the first sacrificial layers and the second sacrificial layers;

forming a channel structure in the first through-hole, wherein the channel structure comprises, in an order from inner to outer of the channel structure, a channel layer, an insulation layer wrapped around the channel layer, and a charge capture layer wrapped around the insulation layer;

forming a plurality of first cavities by removing the first sacrificial layers;

forming a plurality of gate structures in the first cavities;

forming a plurality of second cavities between neighboring gate structures by removing the second sacrificial layers; and forming a plurality of gate contact components each connecting to a gate structure.

7. The method of claim 6, wherein the first sacrificial layers and the second sacrificial layers form a staircase pattern, and wherein forming a support structure in the first sacrificial layers and the second sacrificial layers comprises:

forming a first dielectric layer on the staircase pattern comprising the first sacrificial layers and the second sacrificial layers;

forming an opening exposing the upper surface of the substrate by etching the first dielectric layer, the first sacrificial layers and the second sacrificial layers;

forming the pillar support component in the opening; and forming a second dielectric layer covering the pillar support component on the first dielectric layer.

8. The method of claim 7, wherein forming the pillar support component in the opening comprises:

forming a first cover layer on a side surface and the bottom of the opening;

forming the pillar kernel filling the opening on the first cover layer;

forming a pillar cavity by etching back a portion of the pillar kernel; and forming a second cover layer filling the pillar cavity, wherein the first cover layer and the second cover layer form the common cover layer wrapped around the pillar kernel.

9. The method of claim 6, wherein the pillar kernel is made of silicon dioxide and the common cover layer is made of undoped polycrystalline silicon.

10. A method for manufacturing a flash memory device, comprising:

providing a substrate;

forming a plurality of first sacrificial layers and a plurality of second sacrificial layers stacked in an alternating manner, wherein the first sacrificial layers contain material that is different from the second sacrificial layers;

forming a support structure in the first sacrificial layers and the second sacrificial layers, wherein the support structure comprises at least one pillar support component, wherein the pillar support component comprises a common cover layer and a pillar kernel, wherein the common cover layer is made of a semiconductor material, directly contacts at least two of the first sacrificial layers, and directly contacts at least two of the second sacrificial layers, and wherein the pillar kernel is solid, is positioned inside the common cover layer, directly contacts the common cover layer, and is made of a material different from the semiconductor material;

forming a first through-hole exposing an upper surface of the substrate by etching the first sacrificial layers and the second sacrificial layers;

forming a channel structure in the first through-hole, wherein the channel structure comprises, in an order from inner to outer of the channel structure, a channel layer, an insulation layer wrapped around the channel layer, and a charge capture layer wrapped around the insulation layer;

forming a plurality of first cavities by removing the first sacrificial layers;

forming a plurality of gate structures in the first cavities;

forming a plurality of second cavities between neighboring gate structures by removing the second sacrificial layers; and forming a plurality of gate contact components each connecting to a gate structure.

11. The method of claim 10, wherein the pillar kernel is positioned between two portions of the common cover layer in a direction perpendicular to the substrate.

12. The method of claim 11, wherein the pillar kernel directly contacts each of the two portions of the common cover layer.

* * * * *